United States Patent
Dabov et al.

(10) Patent No.: US 8,385,060 B2
(45) Date of Patent: Feb. 26, 2013

(54) HANDHELD COMPUTING DEVICE

(75) Inventors: Teodor Dabov, San Francisco, CA (US); Phillip M. Hobson, Menlo Park, CA (US); Anthony Montevirgen, Milpitas, CA (US)

(73) Assignee: Apple Inc., Cupertino, CA (US)

( * ) Notice: Subject to any disclaimer, the term of this patent is extended or adjusted under 35 U.S.C. 154(b) by 614 days.

(21) Appl. No.: 12/551,384

(22) Filed: Aug. 31, 2009

(65) Prior Publication Data

US 2011/0051360 A1    Mar. 3, 2011

(51) Int. Cl.
*H05K 7/02* (2006.01)

(52) U.S. Cl. .................. 361/679.3; 361/679.55; 29/832; 29/854

(58) Field of Classification Search ............ 361/816, 361/818, 679.01, 679.02, 679.58, 679.56, 361/679.55, 679, 679.27, 679.26, 679.09, 361/679.08, 686, 683, 679.3, 680, 679.4; 29/592.1, 830, 832, 854, 831; 715/864; 345/173; 439/883, 67; 200/50.28, 43.02, 451 R, 51 R
See application file for complete search history.

(56) References Cited

U.S. PATENT DOCUMENTS

| | | | |
|---|---|---|---|
| 4,691,195 A * | 9/1987 | Sigelman et al. | 340/545.4 |
| 6,956,563 B2 * | 10/2005 | Yamashita | 345/173 |
| 7,099,709 B2 | 8/2006 | Hsu et al. | |
| 7,515,431 B1 | 4/2009 | Zadesky et al. | |
| 7,522,889 B2 | 4/2009 | Wulff et al. | |
| 2005/0128336 A1 * | 6/2005 | Toledano et al. | 348/340 |
| 2005/0200494 A1 * | 9/2005 | Herrmann et al. | 340/693.5 |
| 2007/0046646 A1 * | 3/2007 | Kwon et al. | 345/173 |
| 2008/0100568 A1 * | 5/2008 | Koch et al. | 345/156 |
| 2009/0120684 A1 * | 5/2009 | Kasai et al. | 174/520 |
| 2009/0164035 A1 | 6/2009 | Zadesky et al. | |
| 2009/0185344 A1 | 7/2009 | Zadesky et al. | |

* cited by examiner

*Primary Examiner* — Jinhee Lee
*Assistant Examiner* — Ingrid Wright
(74) *Attorney, Agent, or Firm* — Womble Carlyle Sandridge & Rice LLP

(57) ABSTRACT

A handheld computing device is disclosed. The handheld computing device includes a seamless housing formed from an extruded tube. The extruded tube includes open ends and internal rails which serve as a guide for slidably assembling an operational assembly through the open ends of the extruded tube, a reference surface for positioning the operational assembly relative to an access opening in the seamless housing, and a support structure for supporting the operational assembly during use.

16 Claims, 17 Drawing Sheets

M-frame Assembly

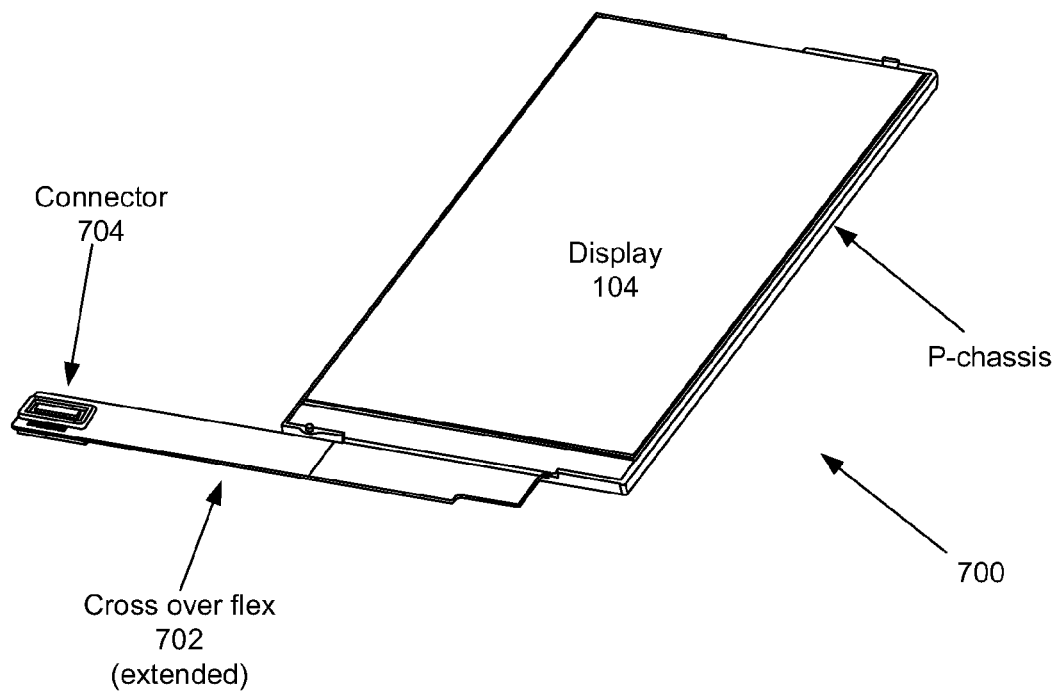
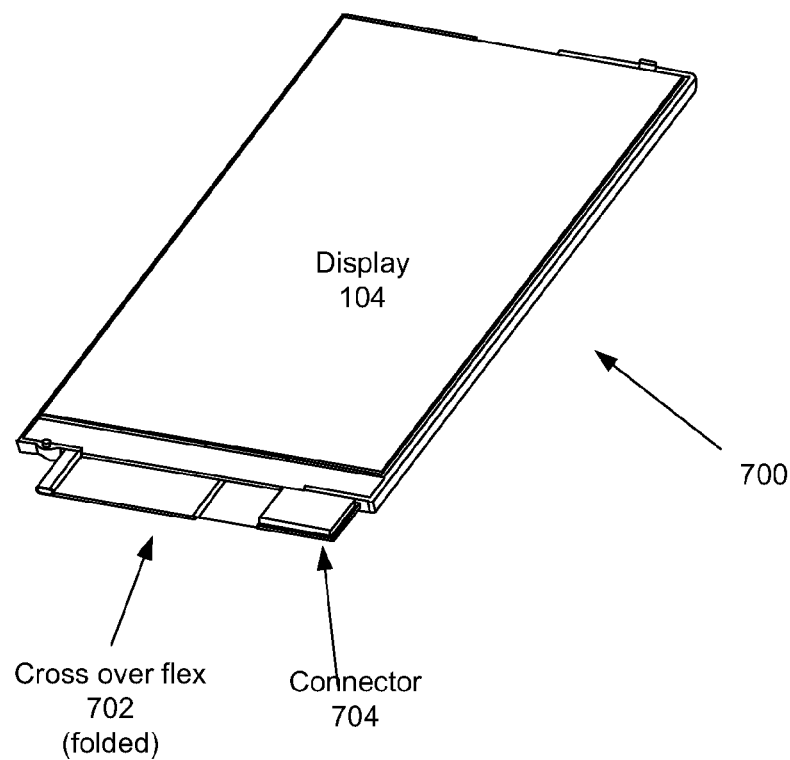
FIG. 7

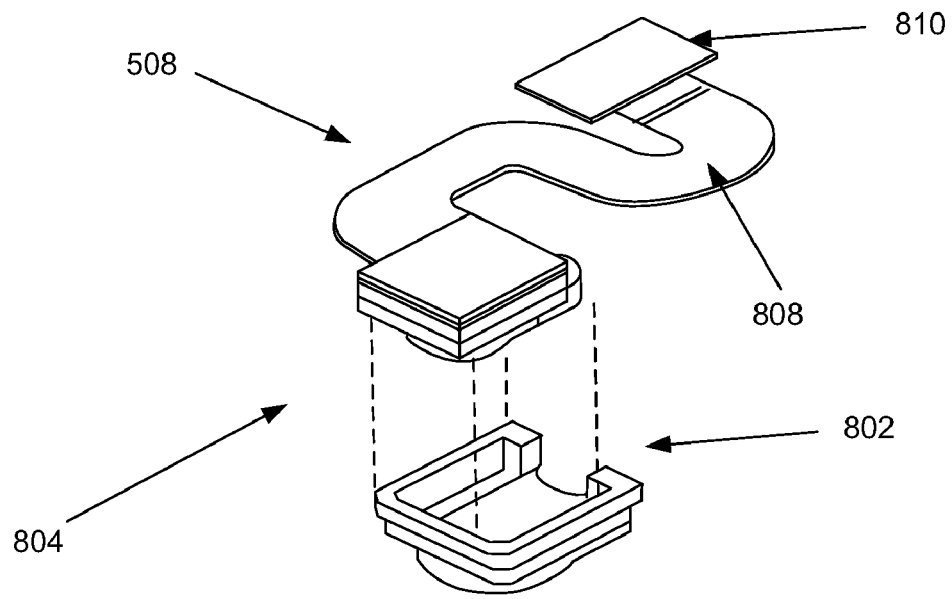
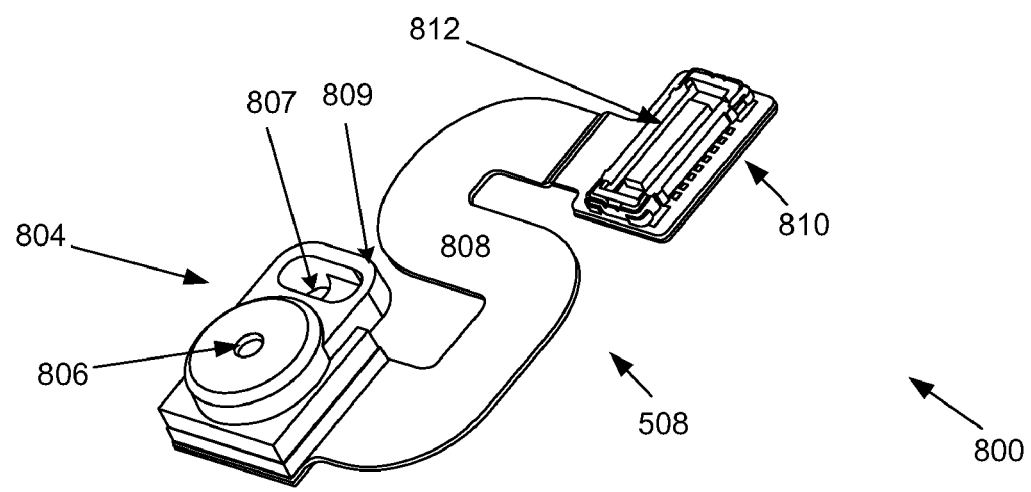
FIG. 8A

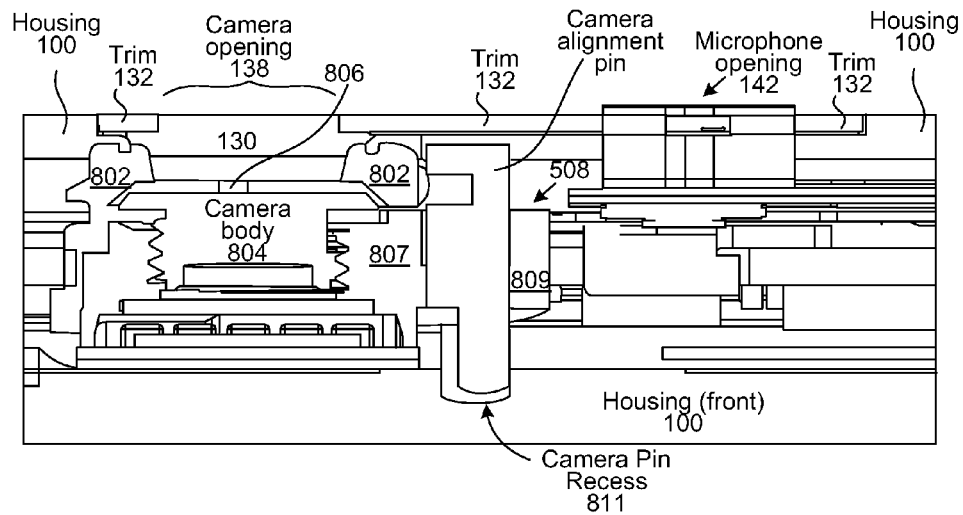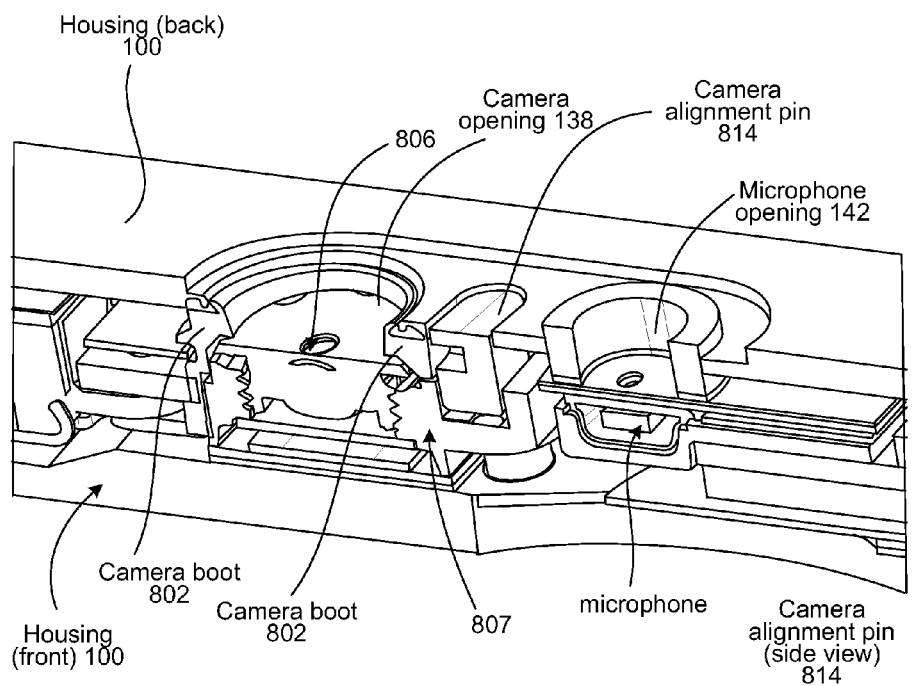
FIG. 8B
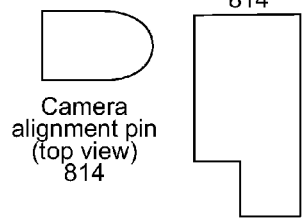

I/O flex

Audio
Circuit

HANDHELD COMPUTING DEVICE

BACKGROUND OF THE INVENTION

1. Field of the Invention

The present invention relates generally to portable computing devices. More particularly, the present invention relates to enclosures of portable computing devices and methods of assembling portable computing devices.

2. Description of the Related Art

In recent years, portable computing devices such as laptops, PDAs, media players, cellular phones, etc., have become small, light and powerful. One factor contributing to this reduction in size can be attributed to the manufacturer's ability to fabricate various components of these devices in smaller and smaller sizes while in most cases increasing the power and or operating speed of such components. Unfortunately, the trend of smaller, lighter and powerful presents a continuing design challenge in the design of some components of the portable computing devices.

Conventional assembly techniques teach placing the operational components within the enclosure sections at a time after which they are electrically connected. However, even though the individual component can be pre-tested prior to assembly, there is no way to pre-test the assembled components. The only testing that can occur takes place either during the assembly process or immediately after the assembly process is complete. If there is a fault discovered, or the device fails to meet outgoing functional quality requirements, the entire device is either scrapped or dis-assembled in order to find and correct the defective component thereby greatly reducing efficiency and increasing costs.

In view of the foregoing, there is a need for improved component density and associated assembly techniques that reduce cost and improve outgoing quality. In addition, there is a need for improvements in the manner in which small, handheld devices are assembled. For example, improvements that enable structures to be quickly and easily installed within the enclosure, and that help position and support the structures in the enclosure. It is also desirable to minimizing the Z height of the assembled components in order to reduce the overall thickness of the portable computing device and thereby improve the overall aesthetic look and feel of the product.

SUMMARY OF THE INVENTION

A portable electronic device is disclosed. The portable electronic device includes at least a frame and a device module mounted to the frame. The device module includes a first function assembly, a second function assembly, and an electrical interface configured to facilitate communication between the first and the second function assemblies. The first and the second function assemblies are movable relative to one another. The electrical interface can expand or contract commensurate with the relative displacement between the first and the second assemblies. The portable electronic device also includes a user interface module electrically coupled to the device module. The device module and the user interface module are each stand alone modules in that each can be fully function tested prior to being incorporated into the portable electronic device.

A method of assembling a portable electronic device is disclosed. The method can be carried out by performing at least the following operations. Providing a seamless housing, the seamless housing having at least a first open end and a reference structure formed on an inside surface of the housing, inserting a pre-tested device module into the first open end using a resilient reference structure as a guide. The device module includes a first function assembly and a second function assembly the first function assembly being fixed to the frame and the second function assembly being moveably mounted to the frame such that the second function assembly can move relative to the first function assembly. Next, affixing the location of the first function assembly to an reference point on the seamless housing and moving the second function assembly in relation to the fixed first function assembly.

A user interface module for use in a portable electronic device is disclosed. the user interface module including at least a user touch interface having a plurality of discrete regions sensitive to a user's touch, a plurality of actuators each being responsive to a user touch event at a corresponding one of the plurality of touch sensitive regions, a flexible electrical connector configured to electrically connect the plurality of actuators to a connector, and a diffusion bonded support plate formed of a number of chemically etched layers, the support place providing support to the user interface assembly, wherein the user interface module is fully pre-tested prior to installation in the portable electronic device.

An integrated connector adapted for electrically connecting each of a plurality of components to an external circuit independent of one another where the components arranged in at least two dimensions is disclosed. The integrated flex connector including at least a single electrical board to board connector, a first portion having a first connector electrically connected to the single electrical board to board connector, a second portion independent of the first portion, the second portion having a second connector electrically connected to the single electrical board to board connector, and a third portion independent of the first portion and the second portion, the third portion having a third connector electrically connected to the single electrical connector, wherein the single electrical connector provides an independent electrical path for the each of the first, second, and third connectors to the external circuit.

BRIEF DESCRIPTION OF THE DRAWINGS

The invention will be readily understood by the following detailed description in conjunction with the accompanying drawings, wherein like reference numerals designate like structural elements, and in which:

FIG. 7 shows an embodiment of display device showing a cross over flex in a folded state and an extended, or open, state.

FIGS. 8A-8C shows an embodiment of camera module and camera boot.

DETAILED DESCRIPTION OF THE INVENTION

Figure 1A:
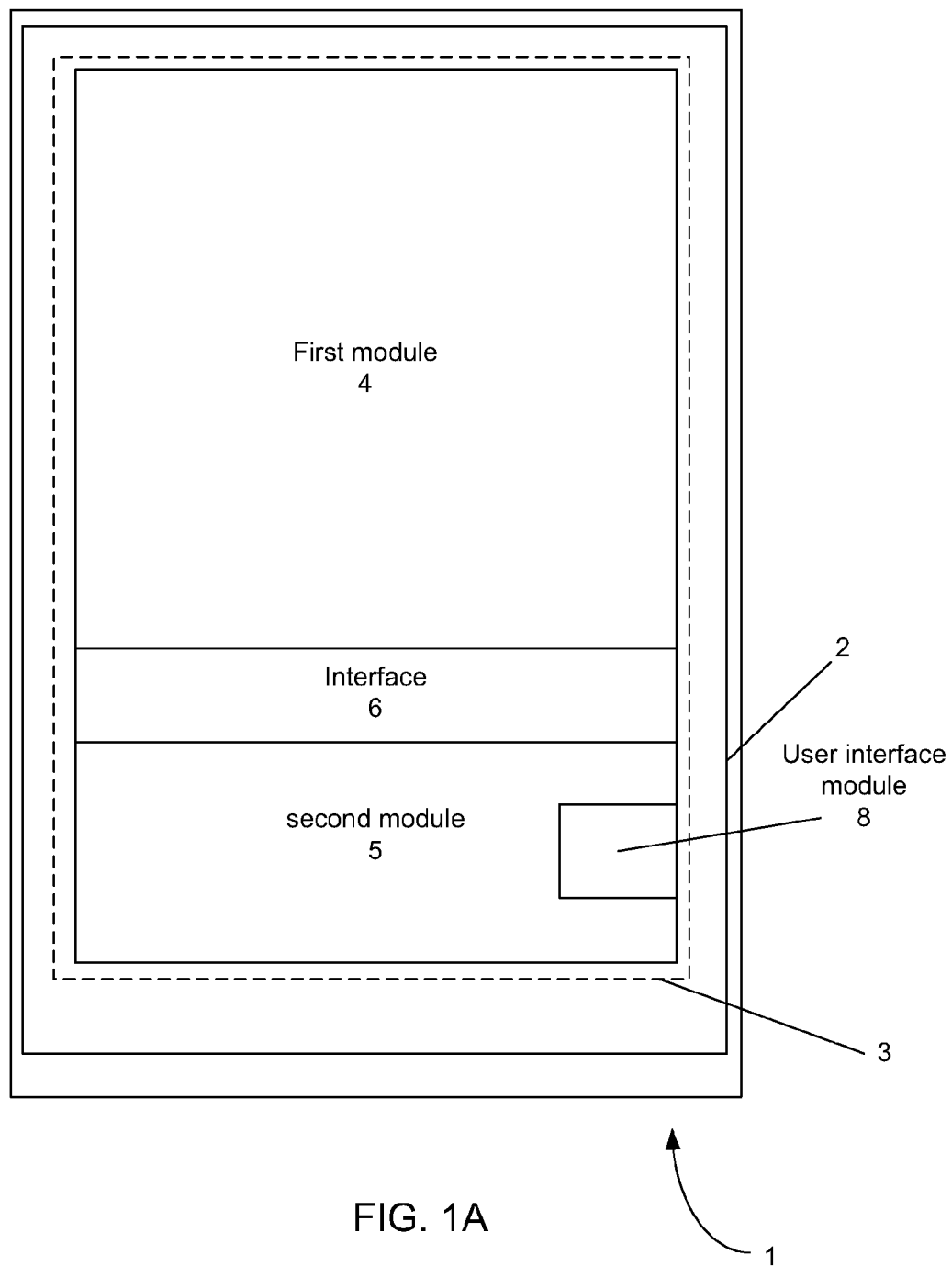
FIG. 1A shows a generic block diagram a modular portable electronic device in accordance with the described embodiments.

The invention generally pertains to portable computing devices and more particularly to components of and methods for assembling portable computing devices. One aspect of the invention relates to a seamless housing formed of a material such as plastic or metal such as aluminum. The seamless housing can be formed via an extrusion process. The metallic nature of the seamless housing can provide superior wear properties as well as provide superior impact protection for internal components in addition to provide an electrical grounding plane. In addition to providing superior wear and protection, the metal used to form the seamless housing can be worked to provide a more aesthetically pleasing appearance thereby improving the overall user experience. For example, the sheen and luster of aluminum can be used to provide an aesthetically pleasing appearance to the portable computing device.

The seamless housing can also include at least one open end, a window to receive a display device, and an opening to receive a user input device, such as a touch sensitive click wheel. The open end can be sized for slideably receiving a m-frame assembly, also referred to as a sled, formed of a number of operational components mounted to a metal frame. The metal frame can be used as a metal support on which a number of operational components can be mounted at a fixed position on the metal frame. Other components, however, can be mounted on the metal frame and yet still be moved relative to the fixed components. In this way, an assembly operator can easily align those components that must be placed in specific locations (such as the audio jack and connector being flush to the bottom of the housing) while the other components remain fixed. The operational components mounted to a fixed position on the metal frame can include a display device since it is critical that the display device remain centered in the display window. Components that can be mounted and yet still be moved in relation to the display device can include a main logic board also referred to as a printed circuit board (PCB). The PCB can act as a transport vehicle for components attached thereto such as a microprocessor, a microphone, a camera, a data port having a connector, a piezo-electric audio transducer, and an audio jack. In the case of the audio jack, the ability to move the PCB in relation to the display enables an assembly operator to move the audio jack flush to the bottom of the portable electronic device while still maintain the proper centering of the display.

In order to increase density of components mounted to the metal frame, the number of board to board interconnects, the pitch between interconnects, and the amount of board real estate used for interconnects can be optimized. This optimization can be carried out in a number of ways. For example, using surface mount and soldering whenever possible provides for reduced use of board real estate and better electrical connections than would otherwise be used if a conventional connector was used. An integrated flex where a number of components are soldered to a single flex structure having a single board to board connector is one approach that takes advantage of both surface mount, soldering, and reduced number of connectors. A stiffener plate can be used to disperse stress on the flex at a connection. The stiffener plate can be metal and also used to provide a ground connection.

The single integrated flex can be used to connect a plurality of different operational components. The single integrated flex can include a single board to board interconnect suitable for providing an electrical connection between the plurality of operational components and a substrate or printed circuit board (PCB). The plurality of operational components connected by way of the single integrated flex can include the audio jack and associated circuitry, the microphone, a hold switch, and the piezo-electric audio transducer. The singly integrated flex allows for pre-assembly testing of the components attached thereto simply by connecting the single board to board connector to a test fixture.

Another approach that can taken to facilitate assembly and thereby improve assembly throughput is by providing novel techniques for mounting components onto the metal frame. One such technique is referred to as "book" mounting whereby the metal frame is structured to accommodate the placement of a component on one side of the metal frame. The assembly operator can then lower the component as if closing a book onto the other side of the metal frame where a snap attachment feature can be used to secure the component. Using this technique, the assembly of small components onto the metal frame is easy and less time consuming than conventional approaches to mounting components.

Typically, the m-frame assembly is formed in a pre-insertion assembly operation separate from the assembly process that is used to manufacture the portable computing device. One of the advantages of pre-assembling the m-frame assembly is that once assembled, the m-frame assembly can be functionally tested prior to being inserted into the housing. In this way, only those m-frame assemblies that have been determined to pass functional testing are used in the manufacture of the portable computing device thereby greatly improving assembly outgoing quality. Moreover, by being able to pre-test the m-frame assembly, any debugging, tuning, or repair can be performed prior to the actual insertion of the m-frame assembly into the seamless housing.

In addition to the stand alone m-frame assembly, a stand alone touch sensitive user input device, such as a click or touch wheel, can be assembled and tested separately from the m-frame assembly. Similar to the m-frame assembly, the stand alone user input device can be functionally tested prior to assembly into the portable computing device. In this way an inventory of pre-tested stand alone m-frame subassemblies and stand alone click wheel assemblies can be created and called upon as needed in, for example, a just in time (JIT) type assembly operation. Furthermore, the modularity of the stand alone m-frame assembly and click wheel assembly affords the opportunity to easily repair a defective portable computing device by merely replacing the defective click wheel assembly or m-frame assembly without the need to debug and repair in situ as is conventionally the case.

The click wheel assembly can include a number of components such as a click wheel faceplate having a number of button function icons and a center button. A number of dome buttons corresponding to the button function icons are connected to a flex structure separate from a flex structure on which dome button corresponding to the center button is mounted. In the described embodiment, in order to reduce Z height, the dome buttons are mounted in a reverse orientation. Furthermore, by mounting the dome button associated with the center button on a separate flex structure than that used for the dome buttons corresponding to the center button, less material can be used. Additionally, all of the reverse mounted dome buttons are mounted to the same side of their respective flex structures. In this way, the dome button/flex structures can be fabricated in a single set up.

Once the m-frame assembly has been properly inserted and the display centered and locked in place, the stand alone click wheel assembly can be electrically connected and placed within the click wheel opening in the housing. The click wheel assembly can grounded to a chassis ground (i.e., metal housing) by way of a metallic coil spring included in a hole formed in a click wheel support structure. The metallic spring can provide both a path to ground (i.e., the metallic housing) and resilient support for the click wheel assembly.

A resilient reference structure on an interior surface of the seamless housing can be used as a guide during assembly. The resilient nature of the reference structure can be provided by resilient material, such as plastic, attached to a bottom surface of the seamless housing. During assembly, the m-frame assembly can be placed within the open end of the seamless housing. A display device chassis (usually formed of plastic) can be placed in contact with the resilient material of the guide. The m-frame assembly can then be slideably inserted into the seamless housing where the display device chassis rides along the resilient guide. The m-frame assembly is inserted until an active area of the display device is centered with respect to a black mask within a display window formed in the seamless housing. Once the display device is centered, a protective cover glass having a locking feature such as a flange can be placed on the display and locked into place. The locking in place of the protective cover can also have the effect of restraining the m-frame assembly in XY. Furthermore, the protective cover glass can also assert a force onto the display device chassis that can be opposed by the resilient guides onto which the display device rests. This opposing force can have the effect of forcing the display device/protective glass up against the housing thereby assuring that the protective glass is substantially flush with the housing.

As described above, in order to properly align the various components within the seamless housing after the display device is centered and fixed in place, the assembly operator is provided the opportunity to move other components relative to the display device. However, in order to facilitate this movement, the display device has what is referred to as a cross over flex that provides a modicum of additional length of flex used to accommodate the necessary movement of the other components relative to the display device. Moreover, this cross over feature allows for greater allowance for the placement of a corresponding connector on the PCB.

These and other embodiments of the invention are discussed below with reference to FIGS. 1-14. However, those skilled in the art will readily appreciate that the detailed description given herein with respect to these figures is for explanatory purposes as the invention extends beyond these limited embodiments.

FIG. 1A illustrates portable electronic device 1 in accordance with the described embodiments. Device 1 can be configured as any of a number of electronic devices such as a portable media player, cell phone, smart phone, etc. In the described embodiment, portable electronic device 1 can be modular in nature. By modular it is meant that device 1 can be formed of modules each containing a plurality of functional assemblies. This modularity can also facilitate efficient and cost effective modular assembly practices described below. In the described embodiments, the modules can be stand alone modules in that each module can be tested and confirmed as being fully functional prior to being incorporated into device 1. In this way, only fully tested and fully operational modules can be used in the assembly of device 1 thereby substantially improving assembly yield. Modules, in turn, can include a plurality of functional assemblies. The functional assemblies can include components arranged to perform specific functions. For example, a camera assembly can include a camera configured to provide both still and video to a processor assembly.

Device 1 can include frame 2 that can be used to provide mechanical support for device module 3. Device module 3 can, in turn, include a number of functional assemblies such as assembly 4 connected to assembly 5 by way of interface 6. In the described embodiments, device module 3 can be a stand alone module having a number of functional assemblies that can be tested prior to assembly into the device 1. Being stand alone, module 3 can be connected to an external circuit such as a tester configured for functional testing. Typically, the tester has an on board power supply arranged to supply a pre-determined supply voltage to the circuit under test (i.e., module 3). As a result of the testing, any assemblies found to be either malfunctioning or not operating according to spec can either be repaired or replaced. In this way, an inventory of pre-tested device modules can be stored and made ready for assembly of electronic device 1.

Device 1 can be assembled in a labor and cost effective manner by taking advantage of the modularity inherent in the design of device 1. Frame 2 can be used as a transport mechanism (along the lines of a sled used to transport objects laid thereon) as well as a supporting structure. Since module 3 is mounted to frame 2, frame 2 can be used to transport module 3 into housing 7 in one operation avoiding the cost in time and labor of in situ component assembly. Since module 3 has been fully tested and confirmed operational prior to assembly, there is a high probability of continued operability after the insertion procedure. However, even in those rare instances where an inserted module is found to be defective, the defective module can be easily swapped for another functioning module. In this way, there is no need for time consuming failure analysis. Device 1 also includes a separate user interface module 8 that, like device module 3, can be fully function tested prior to being electrically coupled to device module 3 and incorporated into device 1.

The described embodiment can provide a number of features that facilitate the assembly of device 1. For example, assembly 4 and/or assembly 5 can be mobile with respect to housing 7 and/or each other. In some cases it may be necessary to affix assembly 4 to a specific position relative to an external reference (such as an opening in housing 7, for example). One such example can be if assembly 4 includes a display device, the display device must be precisely centered within an opening in housing 7. Therefore, once the display is centered, the position of assembly 4 is fixed and cannot move relative to housing 7. However, even though assembly 4 must remain fixed, assembly 5 may have to be aligned with respect to housing 7 at a position inconsistent with the current relative position of assembly 4. Therefore, frame 2 can include an intra-frame transport mechanism on which assembly 5 can be mounted. The intra-frame transport mechanism can allow assembly 5 to move relative to assembly 4. In order to accommodate any movement between assembly 4 and assembly 5, interface 6 can be expand (or contract) commensurate with the relative displacement between assembly 5 and assembly 4.

Figure 1B:
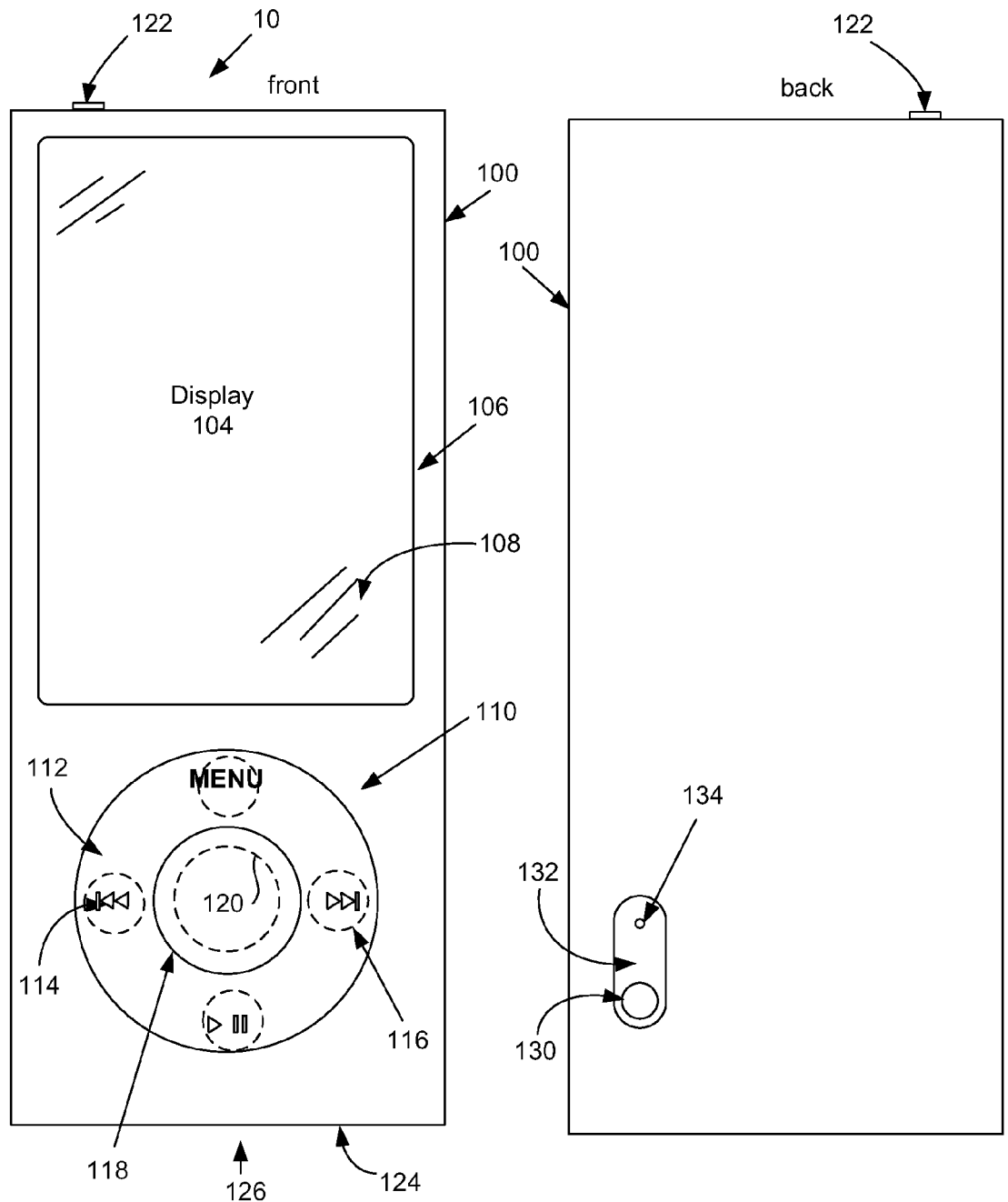
FIG. 1B is a perspective diagram of an embodiment of a handheld computing device.

FIG. 1B illustrates a specific embodiment of modular portable electronic device 1 shown in FIG. 1A. More specifically, FIG. 1B shows a front and rear view of fully assembled handheld portable electronic device 10. Portable electronic device 10 can process data and more particularly media data such as audio, video, images, etc. By way of example, portable electronic device 10 can generally correspond to a music player, game player, video player, camera, cell phone, personal digital assistant (PDA), and/or the like. With regards to being handheld, portable electronic device 10 can be operated solely by the user's hand(s), i.e., no reference surface such as a desktop is needed. In some cases, portable electronic device 10 can be sized for placement into a pocket of the user. By being pocket sized, the user does not have to directly carry the device and therefore the device can be taken almost anywhere the user travels (e.g., the user is not limited by carrying a large, bulky and heavy device). By way of example, the portable electronic device 10 can correspond to consumer electronic products such as computers, media players, personal digital assistants (PDA), telecommunication devices (phone), personal e-mail or messaging devices and/or the like. In one example, the electronic device can correspond to an iPod Nano™ available by Apple Inc. of Cupertino, Calif.

Portable electronic device 10 can include housing 100 configured to at least partially enclose any suitable number of components associated with the electronic portable electronic device 10. For example, housing 100 can enclose and support internally various electrical components (including integrated circuit chips and other circuitry) to provide computing operations for the device. The integrated circuit chips and other circuitry can include a microprocessor, memory, a battery, a circuit board, I/O, various input/output (I/O) support circuitry and the like. Although not shown in this figure, housing 100 can define a cavity, or lumen, into which various mounted components can be inserted. In the described embodiment, at least one fully tested stand alone assembly having various operational components mounted thereon can be inserted into an open end of housing 100. Once properly positioned and fixed in place, a stand alone and fully tested user interface can be electrically connected to the stand alone assembly and placed within a user interface opening in housing 100. The user interface can then be locked in place using one of two endplates that are placed on both of the open ends of housing 100. In this way, the endplates serve to seal the operating components inside housing 100 preventing dust and other environmental contaminants from entering. Cosmetic caps can be placed over the endplates to improve the overall aesthetics of portable electronic device 10.

In addition to providing support and prevention of environmental contamination from damaging the internal components, housing 100 can define at least in part the outward appearance of portable electronic device 10. That is, the shape and form of the housing 100 can help define the overall shape and form of the portable electronic device 10 or the contour of the housing 100 can embody the outward physical appearance of the portable electronic device 10. Any suitable shape can be used. In some embodiments, the size and shape of the housing 100 can be dimensioned to fit comfortably within a user's hand. In some embodiments, the shape includes a slightly curved back surface and highly curved side surfaces. The shape will be described in greater detail below. Housing 100 can be integrally formed in such as way as to constitute is a single complete unit. By being integrally formed, the housing 100 has a seamless appearance unlike conventional housings that include two parts that are fastened together thereby forming a reveal, a seam there between. That is, unlike conventional housings, the housing 100 does not include any breaks thereby making it stronger and more aesthetically pleasing.

As seen on the front view, portable electronic device 10 can include display 104. Display 104 can be fixedly mounted onto a supporting metal frame using a fixing agent such as adhesive that can also act as a dust shield. Display 104 can be used to display images such as video, still images, a graphical user interface (GUI) as well as other information to the user (e.g., text, objects, graphics). By way of example, display 104 can be a liquid crystal display (LCD). When portable electronic device 10 is being assembled, the frame on which display 104 is mounted can be inserted into housing 100 using one of the open ends of housing 100 until display 104 is centered within display window opening 106. Protective layer 108 can be positioned within opening 106 in front of the display 104 in order to protect display 104 from damage. Protective layer 108 can be formed from any of a number of clear materials such as clear polycarbonate plastic, glass, etc. In the described embodiment, protective layer 108 can include a locking feature (such as a flange). When protective layer 108 is placed over display 104 within the display window opening 106, the locking feature can be mated with housing 100 thereby applying pressure to display 104. The applied pressure has the effect of locking into position the various internal components (such as a main logic board, or MLB) mounted to the supporting metal frame on which display 104 is also mounted.

Portable electronic device 10 can also include one or more input devices configured to facilitate a transfer of data from the outside world into the portable electronic device 10 and vice versa typically at the behest of a user. The one or more input devices can be used to perform tracking/scrolling or to make selections or to facilitate a user issuing commands to portable electronic device 10. By way of example, the one or more input devices can correspond to keypads, joysticks, touch screens, touch pads, track balls, wheels, buttons, switches, and/or the like. In the described embodiment, the one or more input devices can include a touch sensitive input device that can take the form of click wheel user interface 110 (being the visible portion of click wheel assembly described in detail below). Click wheel user interface 110 can include at least an annular click wheel 112. Annular click wheel 112 can be formed of resilient material such as plastic on which are present a number of icons 114 each corresponding to a particular button function that can be performed by portable electronic device 10 in response to a user touch event. By way of example, where portable electronic device 10 is a music player, the button functions can be associated with opening a menu, playing a song, fast forwarding a song, seeking through a menu and the like. In most cases, the button functions are implemented via a mechanical clicking action although they can also be associated with touch sensing.

In order to convert the user touch event to a signal that can be processed and acted upon by portable electronic device 10, each icon 114 can be associated with a corresponding touch sensitive region in the form of click wheel button 116. In order to reduce Z height of click wheel user interface 110 and help to make it flush with the surface of housing 100, click wheel button 116 can take the form of a reversed orientation clickable dome button (also referred to as a reverse dome button). By reverse orientation it is meant that the dome portion of click wheel button 116 is oriented to face down towards the interior of portable electronic device 10 as opposed to facing up away from housing 100 in conventional arrangements. Although not shown, each click wheel button 116 is associated with a sensor arrangement. The sensor arrangement can include a plurality of sensors that are configured to activate as the finger passes over or presses on them. In the simplest case, an electrical signal is produced each time the finger passes or presses a sensor. The number of signals in a given time frame can indicate location, direction, speed and acceleration of the finger on the touch pad, i.e., the more signals, the more the user moved his or her finger. In most cases, the signals are monitored by an electronic interface that converts the number, combination and frequency of the signals into location, direction, speed and acceleration information. This information can then be used by portable electronic device 10 to perform the desired control function.

Click wheel user interface 110 can also include center button 118 associated with touch sensitive region 120. When a user presses center button 118, for example, touch sensitive region 120 can generate a signal that can cause portable electronic device 10 to act in a pre-determined manner. For example, when a user presses center button 118 at the same time that a list of media items are presented on display 104, touch sensitive region 120 can provide a signal to processing circuitry that can cause a particular one of the listed media items presented on display 104 to be selected. It should be noted that center button 118 can also be configured as a reverse dome button.

The position of click wheel user interface 110 relative to seamless housing 100 can be widely varied. For example, click wheel user interface 110 can be placed at any external surface (e.g., top, side, front, or back) of seamless housing 100 that is accessible to a user during manipulation of the portable electronic device 10. Typically, touch sensitive surfaces of click wheel user interface 110 are completely accessible to the user. For example, click wheel user interface 110 can be located in a lower, front area of seamless housing 100. Furthermore, click wheel user interface 110 can be recessed below, level with, or extend above the surface of the seamless housing 100. In the illustrated embodiment, however, the touch sensitive surfaces of click wheel user interface 110 are substantially flush with the external surface of the seamless housing 100.

The shape of click wheel user interface 110 can also be widely varied. For example, click wheel user interface 110 can be circular, rectangular, square, oval, triangular, and the like. Circular shapes, however, allow a user to continuously swirl a finger in a free manner, i.e., the finger can be rotated through 360 degrees of rotation without stopping. Furthermore, the user can rotate his or her finger tangentially from all sides thus giving it more range of finger positions. For example, when the portable electronic device 10 is being held, a left handed user can choose to use one portion of click wheel user interface 110 while a right handed user can choose to use another portion of click wheel user interface 110.

Portable electronic device 10 can also include one or more switches such as power switches, hold switches, and the like accessible through various openings in housing 100. The power switch is configured to turn the portable electronic device 10 on and off, and hold switch 122 is configured to activate or deactivate click wheel user interface 110. This is generally done to prevent unwanted commands by click wheel user interface 110, as for example, when portable electronic device 10 is stored inside a user's pocket.

Portable electronic device 10 can also include one or more connectors for transferring data and/or power to and from portable electronic device 10. Portable electronic device 10 can include audio jack 124, data port 126 and in some cases a separate power port for delivering power to the portable electronic device 10. Audio jack 124 allows audio information to be outputted from portable electronic device 10. Audio jack 124 can receive an audio post (not shown) that can provide audio signals to external audio rendering devices, such as headphones, speakers, etc. Data port 126 allows data to be transmitted and received to and from a host device such as a general purpose computer (e.g., desktop computer, portable computer). For example, data port 126 can be used to upload or down load audio, video and other image data to and from the portable electronic device 10. Data port 126 can also be used to download songs and play lists, audio books, e-books, photos, and the like into a storage mechanism included in portable electronic device 10. In the described embodiment, data port 126 can be any size deemed appropriate such as, for example, a 30 pin connector. As seen by the rear view, portable electronic device 10 can also include a camera module having camera lens 130, the camera module being configured to provide still or video images. Cosmetic camera trim 132 can provide an aesthetically pleasing finish as well as provide support for camera lens 130. A microphone can be used to record audible sound passing through microphone hole 134. In the described embodiment, cosmetic trim 132 can form fit into trim recess 136 formed from housing 100. Trim recess portion 136 of housing 100 can be formed using a machining process, for example. Although not shown in FIG. 1B but described in detail later, trim recess portion 136 can include openings in housing 100 used to provide access to the microphone module, the camera module and an opening used to insert a camera alignment pin. It should be noted that cosmetic trim 132 can obscure the opening used to insert the camera alignment pin since such an opening only need be accessed during the alignment of the camera module.

In some cases, the data port 126 can serve as both a data and power port thus replacing the power port. Data port 126 can be widely varied. In one embodiment, the data port 126 is a peripheral bus connector, such as a USB or FIREWIRE connector. These type of connectors include both power and data functionality, thereby allowing both power delivery and data communications to occur between the portable electronic device 10 and the host device when the portable electronic device 10 is connected to the host device. In some cases, the host device can provide power to the media portable electronic device 10 that can be used to operate the portable electronic device 10 and/or charge a battery included therein concurrently with the operating.

Although the device can connect through various wired connections, it should be appreciated that this is not a limitation. Portable electronic device 10 can also include a mechanism for wireless communications, as either a transceiver type device or receiver only, such as a radio. For example, as shown, portable electronic device 10 can include an antenna that can be disposed internal to housing 100. The wireless communications can be based on many different wireless protocols including for example Bluetooth, RF, 802.11, FM, AM, and the like.

Figure 2:
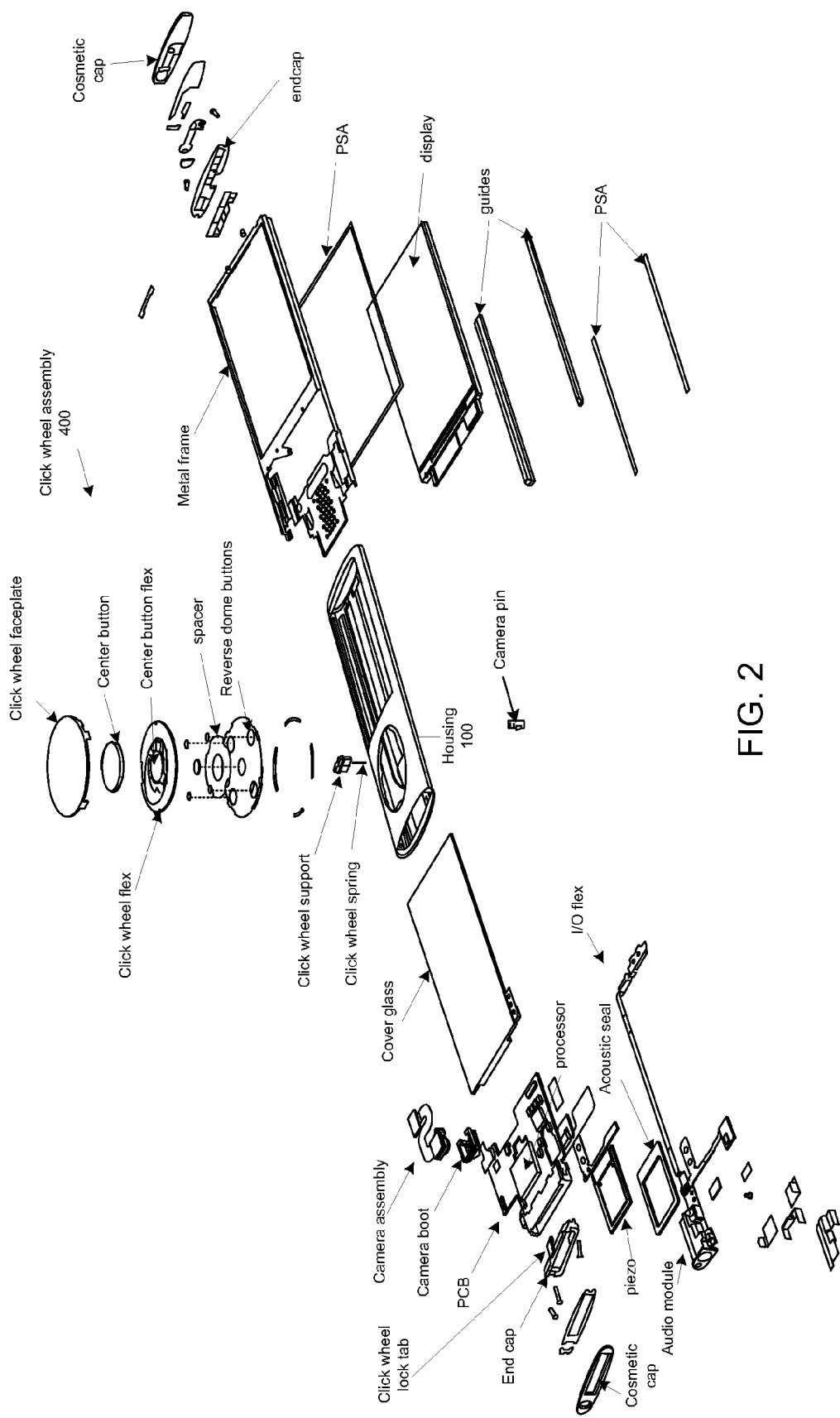
FIG. 2 shows an exploded view of portable electronic device shown in FIG. 1 illustrating the juxtaposition of various electrical and structural components described in more detail below.

FIG. 2 shows an exploded view 200 of portable electronic device 10 illustrating the juxtaposition of various electrical and structural components described in more detail below. The relationship and organization of the components within each layer and relationship between layers can be used to facilitate both the assembly and optimization of Z height tolerances of portable electronic device 10. One aspect of the described embodiments relates to the design of the operational components that facilitate modular assembly of portable electronic device 10. The modular assembly relates to the fact that portable electronic device 10 is formed of a number of self contained modules. These self contained modules can be powered up and tested and if necessary repaired or tuned prior to being inserted into housing 100. In this way portable electronic device 10 can be manufactured to be extremely compact, sturdy, aesthetically pleasing and ergonomic at relatively low cost. The pre-assembled and pre-tested modules can include click wheel assembly 400 and metal or m-frame assembly 500 described in more detail below.

Figure 3:
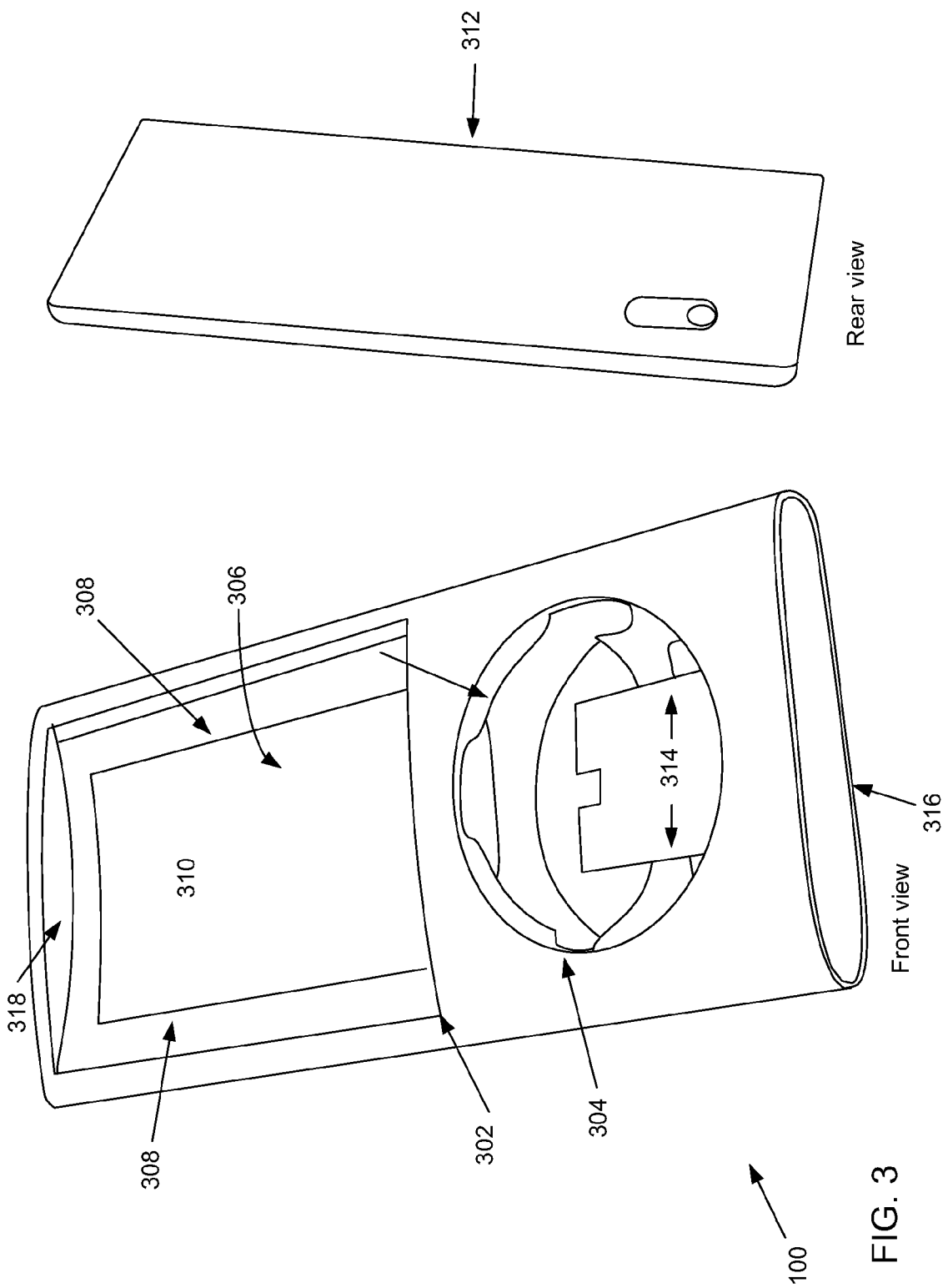
FIG. 3 is a perspective diagram of an embodiment of seamless housing used to form the handheld computing device shown in FIG. 1.

FIG. 3 is a detailed front and rear view of housing 100. Housing 100 can take the form of a seamless housing. The seamless nature of the housing 100 provides an aesthetic look and feel to the portable electronic device 10 as well as provides added resistance to deformation and possible damage to internal components caused by the device being dropped. Housing 100 can be formed of extruded aluminum or other materials such as plastic. It should be noted, however, that this configuration is representative in nature only and does not provide limitations constraining the ultimate scope of the invention. The size and shape of seamless housing 100 can be dimensioned to fit comfortably within a user's hand. In one particular embodiment, seamless housing 100 can be formed from an extruded material such as aluminum or stainless steel thereby providing a seamless look along the length of portable electronic device 10. That is, unlike conventional seamless housings, seamless housing 100 does not include any breaks between the top and bottom ends thereby making it stronger and more aesthetically pleasing. It should be noted that in those cases where portable electronic device 10 incorporates radio frequency (RF) functionality, such as WiFi, BlueTooth, AM/FM radio, any metals used for construction of seamless housing 100 should possess non-magnetic properties in order to reduce any possibility of interfering with the RF functionalities. Such metals can include, for example, aluminum.

In order to help guide at least a portion of the internal components to their desired position within the seamless housing 100 during assembly, housing 100 can include display opening 302 arranged to accommodate display 104 and cover glass 108. During assembly, an operator can center display 104 to display opening 302. Housing 100 can also include click wheel assembly opening 304 arranged to receive fully functional click wheel assembly. Flanges 305 can be used to lock the click wheel assembly in the Z direction. Lumen 306 can be sized and dimensioned for receipt of various internal components used in the assembly of portable electronic device 10. In the described embodiment, an internal reference structure within lumen 306 can include at least two groove structures 308 formed in inner surface 310 of back portion 312 of seamless housing 100. Grooves 308 can be formed by way of a machining process. Once grooves 308 have been formed, similarly shaped rails formed of plastic or other resilient material can be fitted into grooves 308 and attached to inner surface 310. In this way, the rails can provide both an assembly reference surface and a supporting structure for pre-assembled components such as a plastic chassis on which display 104 is mounted.

Cover glass 108 can be locked into place (i.e., in the XY plane) by bonding cover glass 108 to metal frame using adhesive. Cover glass 108 can be locked into the Z direction using flanges formed on cover glass frame which can then be snapped into housing 100. Once cover glass 108 is locked into place, the compressive force applied by cover glass 108 onto the metal frame can be transmitted through the metal frame down to the resilient material in grooves 108 upon which the metal frame rests. The resilient material can respond to the compressive force with an opposing force that travels up through the metal frame to cover glass 108. This opposing force can have the effect of biasing up the metal frame and cover glass 108 (on which cover glass 108 is mounted) thereby forcing cover glass 108 up against housing 100. In this way, the upper surface of cover glass 108 can be made flush with the upper surface of housing 100 at display opening 302.

In order to maximize the perceived audio output of an integrated speaker assembly used by portable electronic device 10 to broadcast audible sound, a portion of inner surface 310 can be removed to form recess 314. Recess 314 can be used to form a front acoustic volume associated with a piezo-electric acoustic transducer. It should be noted that as described below, during assembly, a front acoustic volume can be created by forming a sliding seal between an acoustic seal associated with a piezo-electric audio transducer and recess 314.

In order to more easily accommodate the insertion of various internal components within seamless housing 100, open end 316 (opposite open end 318) can receive a self contained unit formed of operational components mounted to a metal frame, or sled. At the conclusion of the assembly process, an end cap having a click wheel locking feature can be used to cover open end 316 and lock click wheel user assembly in place in the XY direction. The end caps are shaped to conform to the internal cross section of housing 100. In this way, end caps can be inserted into the open ends 316 and 318 such that an outer periphery of the end caps matches an inner periphery of lumen 306. Furthermore, cosmetic caps can be subsequently placed on the end caps and positioned to be flush with rear surface and front surface of seamless housing 100 thereby providing seamless housing 100 with a substantially uniform appearance.

Figure 4:
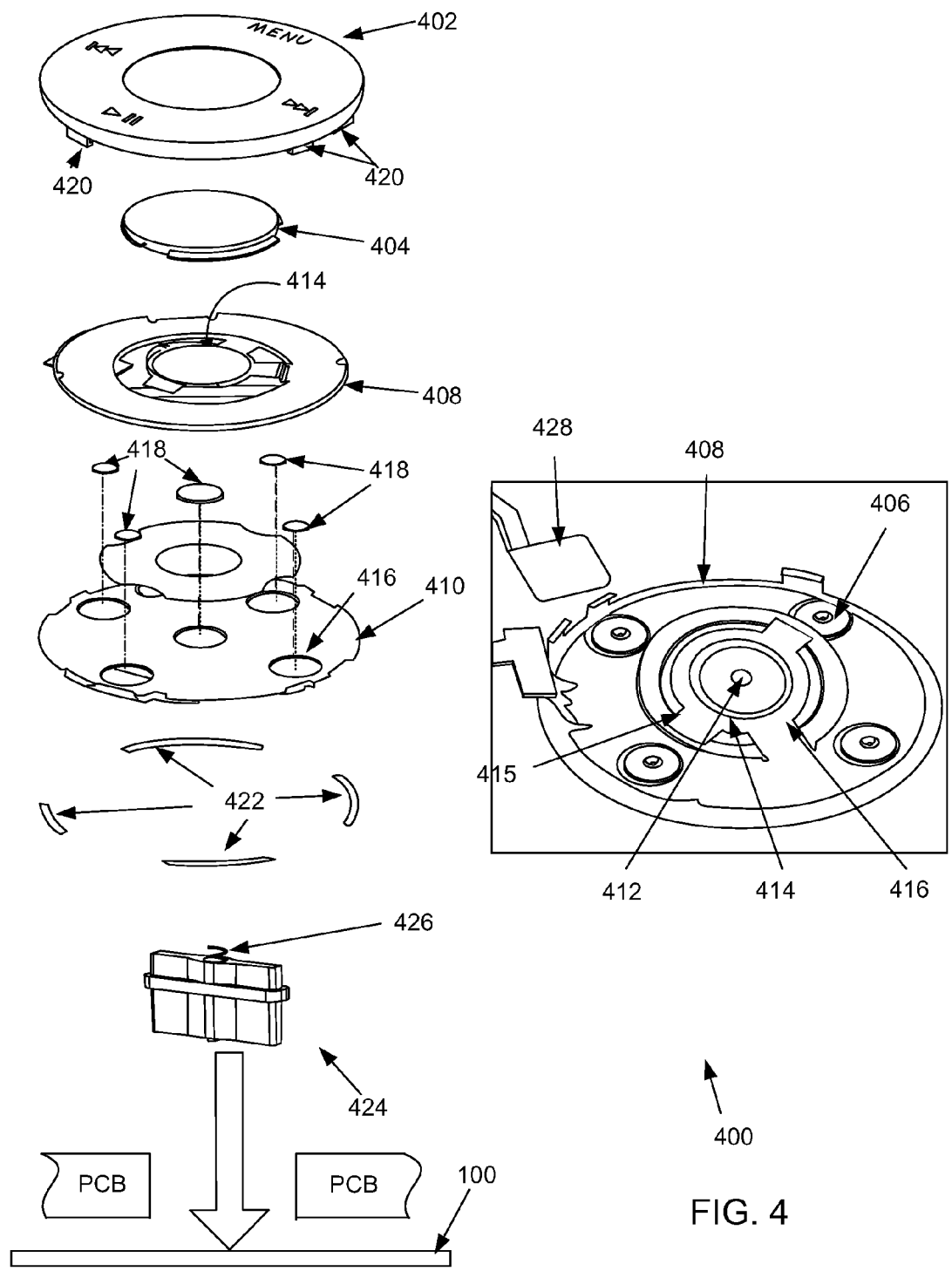
FIG. 4 shows various views of click wheel assembly. The views include an exploded view and a reverse view of click wheel flex showing reverse dome buttons in accordance with the described embodiments.

FIG. 4 shows various views of click wheel assembly 400. The views include an exploded view and a reverse view of click wheel flex showing reverse dome buttons in accordance with the described embodiments. It should be noted that by self contained it is meant that once fully assembled, click wheel assembly 400 is fully functional and capable of being function tested prior to incorporation into portable electronic device 10. In this way, click wheel assembly 400 can be tested and, if necessary, repaired or tuned, prior to incorporation into portable electronic device 10. Turning first to the exploded view, click wheel assembly 400 can include a number of structural and electrical components that cooperate to provide a user input device responsive to a touch event be it from a user's finger, or a stylus, etc. In the described embodiment, the click wheel assembly 400 can include annularly shaped click wheel faceplate 402 and center button plate 404 sized to fit within a central portion of click wheel faceplate 402. Center button plate 404 can be metallic in nature (for both aesthetic and wear protection reasons) whereas click wheel faceplate 402 can be formed of plastic or other lightweight yet durable material. The choice of metal for center button plate 404 and plastic or plastic like material for click wheel faceplate 402 is based upon the fact that it is contemplated that center button plate 404 will receive substantially greater wear from repeated user touches and presses than will click wheel faceplate 402. Any disadvantages due to the metallic nature of center button plate 404 (greater weight, higher cost of fabrication, etc.) is more than offset by the anticipated longer useful lifetime of center button plate 404 than would be expected if center button plate 404 had been fabricated with plastic or other such material. In any case, the nature of the material used to form the various buttons can be varied depending on any number of factors in addition to those discussed above.

Click wheel faceplate 402 can provide a surface that can cooperate with a number of reverse mounted click wheel dome buttons 406 electrically connected to click wheel flex 408. The number of placement of dome buttons 406 can be widely varied. In the particular embodiment shown, dome buttons 406 form an array of four buttons circumferentially arranged equidistant from each other on click wheel flex 408. Click wheel flex 408 can be disposed between click wheel faceplate 402 and click wheel support plate 410. Center button plate 404 can provide a surface that can cooperate with reverse mounted center dome button 412 that is mounted to center button flex 414 by way of "ears" 415 and electrically connected to click wheel flex 408 by way of single flex connector 416. Center button plate 404 can also be directly mounted to center button flex 414. One advantage to using single flex connector 416 and ears 415 is to help reduce the overall height (Z) of click wheel assembly 400. It should be noted that click wheel dome buttons 406 and center dome button 412 can be located on the same side of click wheel flex 408 and center button flex 414, respectively, thereby requiring only a single set up to manufacture. In addition, using only flex connector 416 and to connect center button flex 414 and click wheel flex 408, less material can be used in the manufacture of click wheel assembly 400. Moreover, the single connection provides for easier placement and rotational alignment of click wheel assembly 400 into housing 100.

Click wheel support plate 410 is used to provide structural support for click wheel assembly 400. Accordingly, click wheel support plate 410 can be formed from a number of metal plates formed of, for example, stainless steel (such as SUS 304L) that are fusion bonded together at temperatures in the range of 1000° F. The metal plates can be of different thickness. Fusion bonding results in click wheel support plate 410 having a laminated structure that has both strength and a high degree of Z conformity (i.e., very flat). It is this combination of strength and flatness that enables click wheel assembly 400 to present a more uniform touch sensitivity profile across click wheel faceplate 402 and center button plate 404 to the user. It should be noted that prior to the fusion bonding, some of the constituent plates can be chemically etched to form, for example, dome button recesses 416 suitable for receiving dome button shims 418.

In order to assemble click wheel assembly 400, click wheel faceplate 402, center button plate 404, and click wheel flex 408 are attached to click wheel support plate 410 (after the placement of shims 418) using fasteners 420. Once assembled, adhesive 422 can be used to bond click wheel support plate 410 to a supporting structure (such as a printed circuit board, or PCB) already inserted and fixed within housing 100. In order to prevent diving (movement by click wheel assembly 400 in the Z direction when a user applies pressure), click wheel support structure 424 can be used to provide additional support to click wheel assembly 400. Click wheel support structure 424 can be formed of plastic or other related material. Prior to click wheel support plate 410 being placed and fixed within housing 100 and connected to main logic board using electrical connector 428, click wheel support structure 424 can be dropped, or otherwise placed, within an accommodating space in the supporting structure (such as PCB) upon which click wheel support plate 410 is subsequently bonded. In the described embodiment, click wheel support structure 424 can include a central bore arranged to accommodate metallic spring 426. Metallic spring 426 can be placed in physical contact with (metallic) click wheel support plate 410 and (metallic) housing 100. In this way, metallic spring 426 can be used to both provide resilient support for click wheel assembly 400 and a conductive path to ground (i.e., between click wheel support plate 410 and housing 100).

Figure 5:
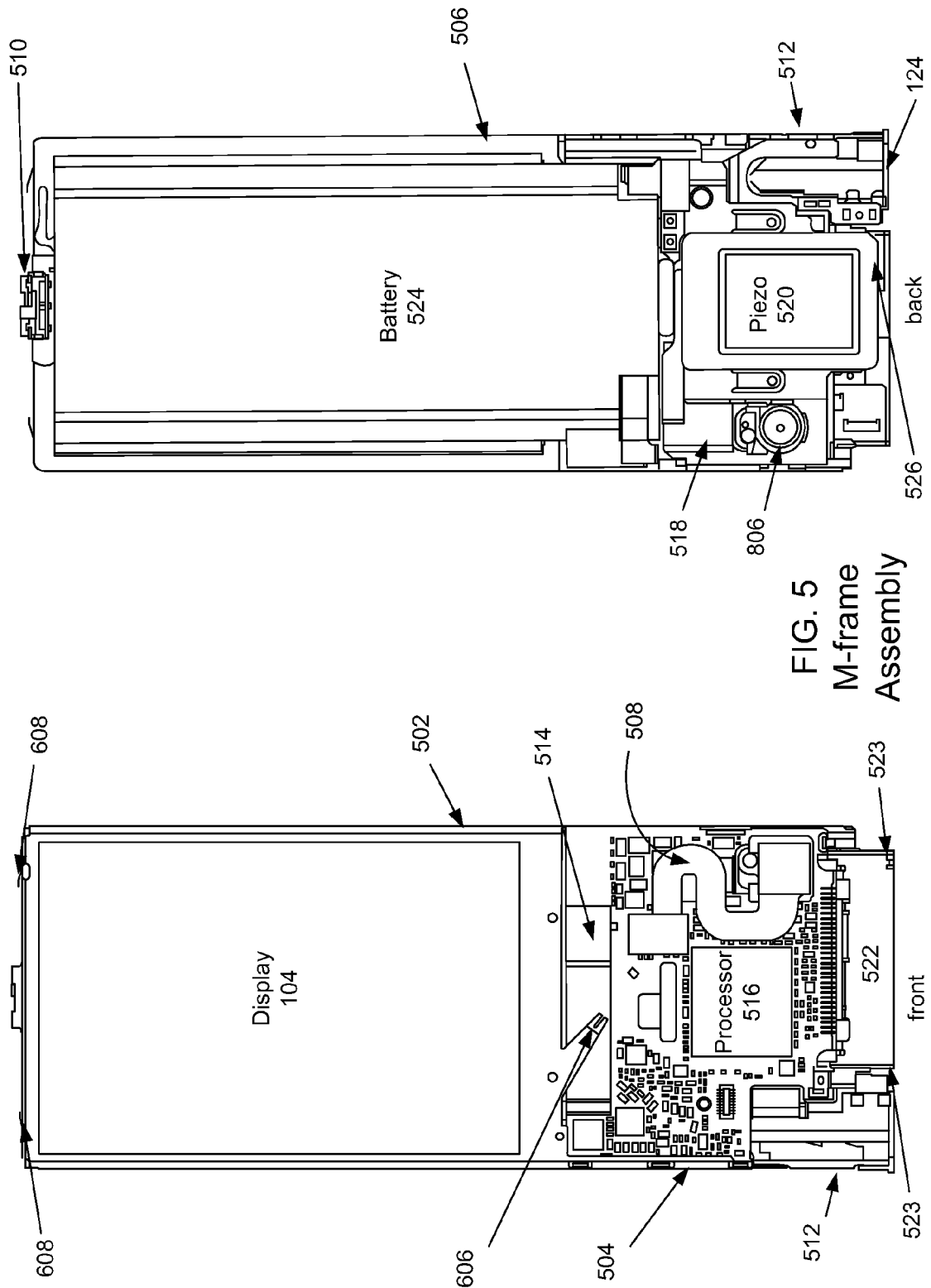
FIG. 5 shows a front and rear view of m-frame assembly in accordance with the described embodiments.

FIG. 5 shows a front and rear view of m-frame assembly 500 in accordance with the described embodiments. M-frame assembly 500 can include some operational components mounted to metal frame 502 whereas the remaining operational components can be mounted to main logic board, or PCB 504, that in turn can be mounted to metal frame 502. Some components, such as display device 104, are mounted to metal frame 502 at a fixed position, whereas other components can be mounted to metal frame 502 and yet be moved along the Y axis relative to display device 104. Components mounted to metal frame 502 can be electrically connected to PCB 504 by way of connectors, or flex. Such connectors can include I/O flex 506. I/O flex 506 can connect microphone module 518, hold button circuit 510, audio module 512, and piezo-electric audio transducer (or more simply, piezo) 520 to PCB 504 using a single board to board (B2B) connector (not shown). Cross over flex 514 (shown in a folded state) can be used to connect display 104 and associated circuitry on PCB 504. Microprocessor 516 and data port 522 can be connected directly to PCB 504. In the described embodiment, data port 522 can be configured as a 30 pin connector. It should also be noted that in order to securely mate with an external data bus, data port 522 can include latching/alignment holes 523 on either or both sides of data port 522. In order to prevent dust or other contamination from entering portable electronic device 10 at the latching holes 523 (with the possibility of obscuring camera lens 132) cosmetically appealing dust seals can be placed over latching holes 523. By cosmetically appealing it can be meant that the resilient material (such as silicone) can be black or other dark color that cannot be readily seen within connector 522 from an outside observer.

Battery 524 which can be located at the rear of display device 104. Battery 524 can operatively coupled to PCB 504 and its various components using a solder connector that couples battery 524 to a connector located on PCB 504. Battery 524 can correspond to a rechargeable lithium polymer battery or a lithium ion prismatic cell. It should be noted that once battery 524 is connected to PCB 504, m-frame assembly 500 can be functionally tested and if necessary, repaired, tuned, or otherwise modified prior to being inserted into housing 100 during the final assembly operation. Acoustic seal 526 can be used to form a front acoustic volume in conjunction with space 314 when m-frame assembly is slid into housing 100 forming a sliding seal between acoustic seal 516 and recess 314 to form a front acoustic volume.

Figure 6:
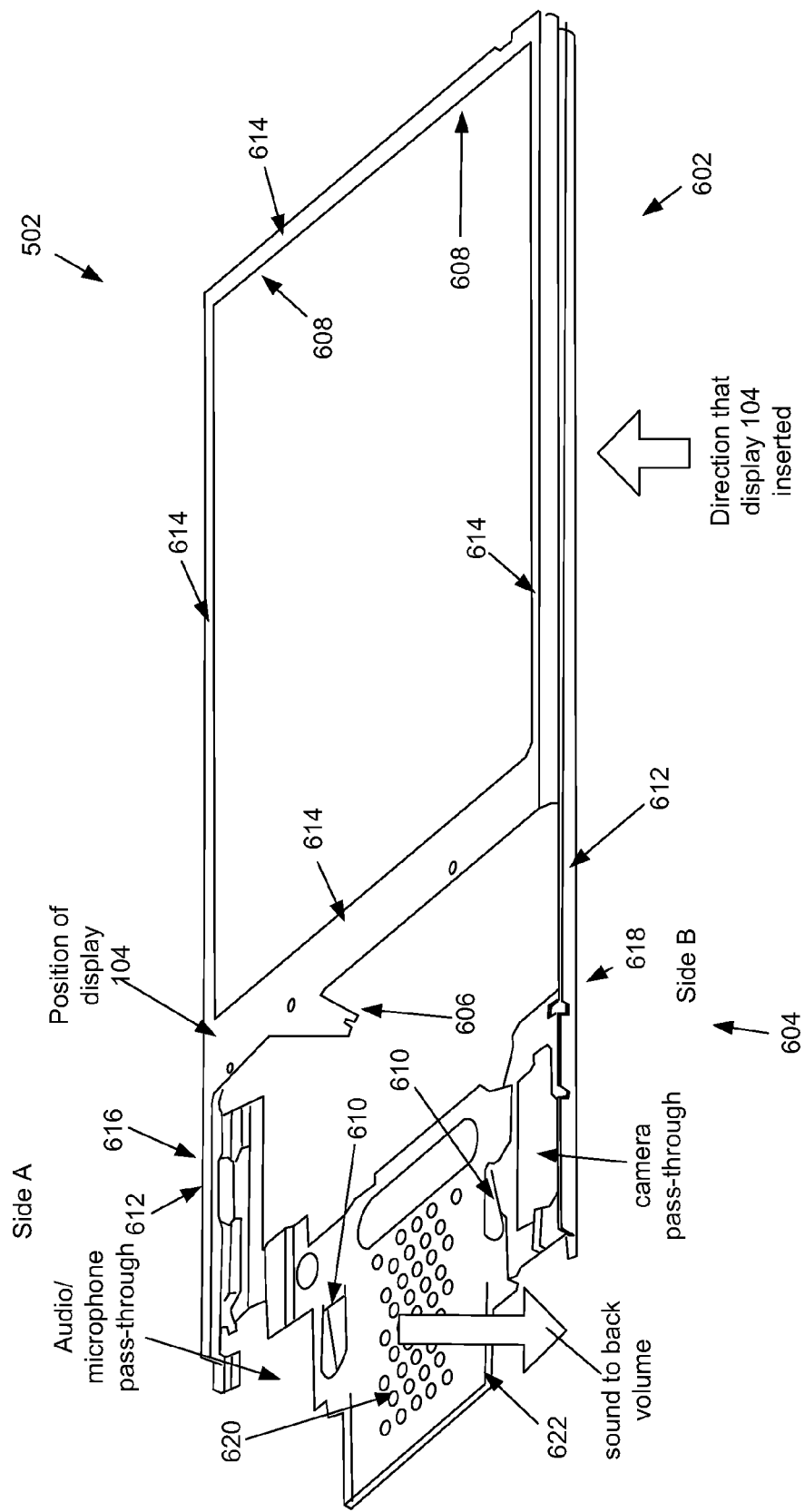
FIG. 6 shows an embodiment of metal frame used in the fabrication of m-frame assembly of FIG. 5.

FIG. 6 shows an embodiment of metal frame 502. Metal frame 502 can provide a metallic support structure upon which a plurality of sub-assemblies formed of associated operational components can be mounted to form metal (m) frame assembly 500. Metal frame 502 can be a multipart metal frame formed of at least two frame components formed of metal (such as stainless steel) that can be laser welded together. For example, metal frame 502 can be formed of display support portion 602 and main logic board (or printed circuit board, PCB) support portion 604 laser welded together. Metal frame 502 can also include a number of integrated features. These integrated features can improve operation of portable electronic device 10 (by providing a robust path to chassis ground) as well as being extremely useful in the assembly of both m-frame assembly 500 as well as the final assembly of portable electronic device 10.

A plurality of ground tabs can be formed into metal frame 502 at various locations that can be used to provide a conductive path to chassis ground (housing 100). For example, front ground tab 606 can be used to provide a conductive path from click wheel assembly 400 to a front, lower portion of housing 100 whereas ground tabs 608 can be used to provide a conductive path to the rear portion of housing 100 whereas ground tabs 610 can provide good grounding for processor 516 and other components mounted to PCB 504.

Another useful feature relates to a system for using rail-like structures to provide limited movement along the Y axis of components attached to metal frame 502. In the described embodiment, rail system 612 can be formed by folding corresponding portions of frame 502 approximately 90 degrees (forming "U" channels in the process). Components mounted to rail system 612 can then be moved along the Y axis with respect to those components fixedly mounted to metal frame 502, such as display 104. This relative movement between components can be important since certain components, such as display 104 and audio jack 124, must be precisely set within housing 100 for both functional and aesthetic reasons. For example, when m-frame assembly 502 is inserted into housing 100, display 104 is fixed to metal frame 502 at display mounts 614. (It should be noted that using the orientation shown in FIG. 6, display 104 is mounted to metal frame 502 at display mounts 614 from the bottom up such that display 104 is facing up as indicated.) As shown below, display 104 can be mounted to metal frame 502 at an LCD seal using adhesive (that acts as a bonding agent as well as dust shield). During assembly, metal frame 502 on which display 104 is bonded is slidably inserted into housing 100 until display 104 is centered within window 108. Since it is crucial that display 104 remain centered, any movement of display 104 after being centered is not acceptable. However, since audio jack 124 and connector 126 must be set flush to the bottom of housing 100, PCB 502 (along with data connector 126 and audio jack 124) must be able to move along the Y axis while display 104 remains stationary in order to easily align data connector 124 and audio jack 124.

The architecture of metal frame 502 can facilitate the mounting of components onto metal frame 502 using what can be referred to as "book" type assembly techniques. Book type assembly techniques refers to installing components (such as PCB) on metal frame 502 by using an undercut feature on one side of metal frame 502 to place a component and a snap attaching feature on the other side of metal frame 502 to receive and snap in place the component. Accordingly, metal frame 502 includes an undercut feature 616 (side A) and a snapping feature 618 (side B). An assembly operator using the book assembly technique would use undercut feature 616 on side A to place a component (such as PCB 504) onto metal frame 502 and then, as one would close a book, lower the other side of PCB 504 to be snapped into place by snapping feature 618 at side B of metal frame 502. Rail system 612 can then provide for moving the attached component in either direction along the Y axis. In this way, book type assembly limits the number of fasteners required and allows for substantially easier assembly.

In order to facilitate the transport of the acoustic energy provided by piezo-electric transducer 520, a plurality of porting holes 620 can be punched into support plate 622. In this way, an acoustic back volume can be created in part (using various leak paths to other interior portions of portable electronic device 10 as the remaining back volume) that in combination with an acoustic front volume (formed in conjunction with acoustic seal 524 and recess 314) can together provide a substantially improved use audio experience.

FIG. 7 shows an embodiment of display device 700 having cross over flex 702 in a folded state and an extended, or open, state. Display device 700 can include display 104 that can take the form of a liquid crystal display (LCD) 104 that can be bonded onto metal frame 502 at display mounts 616 using, for example, adhesive or other appropriate bonding agent. Display device 700 can be operatively connected to PCB 504 and its various components by way of cross over flex 702 at connector 704. As shown, cross over flex 702 can be of sufficient length to be folded over to form a service loop. This service loop enables an assembly operator to move PCB 504 along the Y axis using rails 612 in order to more precisely align various components (such as audio jack) to openings in housing 100. Furthermore, the cross over feature provides for greatly varying the location of the location where connector 704 can be used on PCD 504.

FIG. 8A shows an embodiment of microphone/camera assembly 800. Camera assembly 800 can include camera module 508, camera boot 802 and microphone 812. Camera module 508 can include camera body 804 having camera opening 806. Camera body 804 can be connected to PCB 504 by way of camera flex 808 and connector 810 but is free floating since it must be mounted, aligned and then sealed without moving PCB 504. Camera alignment pin 814 (shown in FIG. 8B) can be used to fix camera module 508 into place using alignment hole 807 in camera arm 809. Camera alignment pin 814 can be fix camera module 508 in place by being inserted into camera alignment pin hole 140 in housing 100, pass through alignment hole 807 in camera arm 809 to rest in camera alignment pin recess 811. In this embodiment shown in FIG. 8B, camera alignment pin recess 811 can be machined from an inner surface of the front of housing 100. It should be noted that recess 136 formed on the back of housing 100 can include camera opening 138, camera alignment pin opening 140, and microphone opening 142. In the described embodiment, camera alignment pin opening 140 is covered by camera trim 132. In this way, only microphone opening 142 and camera opening 138 (having camera lens 130 included therein) can be seen by a user.

Figure 8C:
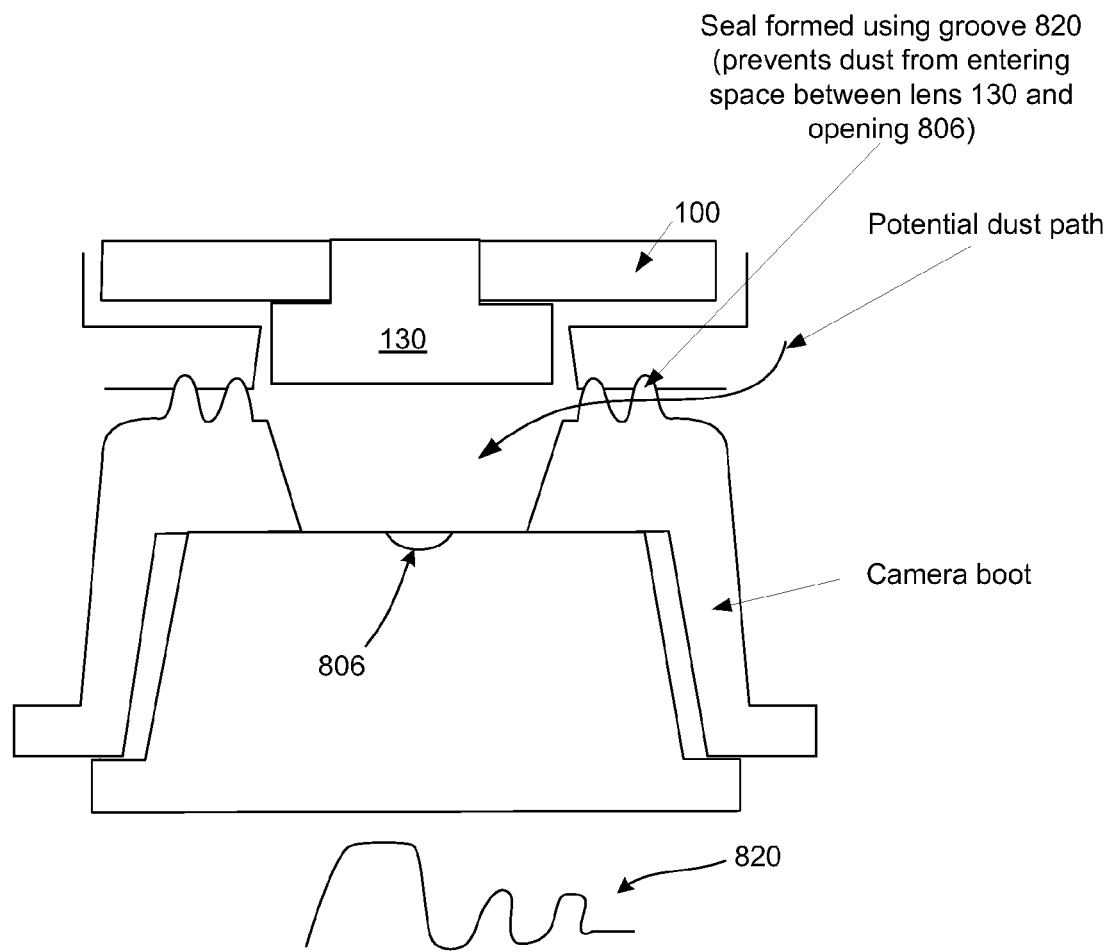

In the described embodiment, camera flex 808 is "S" shaped. Being "S" shaped allows an assembly operator to move camera 804 in relation to PCB 504 in order to maintain the alignment of camera lens 130 and camera hole 806. Camera boot 802 can be formed of silicone or other related material and can enclose camera module 508 providing protection against impact as well as environmental contaminants such as water, dust, etc. As shown in FIG. 8C in side view, camera boot 802 can include a number of camera boot grooves 820 that can be used to form dust seal as a result of camera module 508 being slideably inserted into housing 100. This is particularly important due to the elevated probability of contamination from dust or other contaminants from the outside environment due to the proximity to camera 804 of the latching holes 523 present in port 522.

Figure 9:
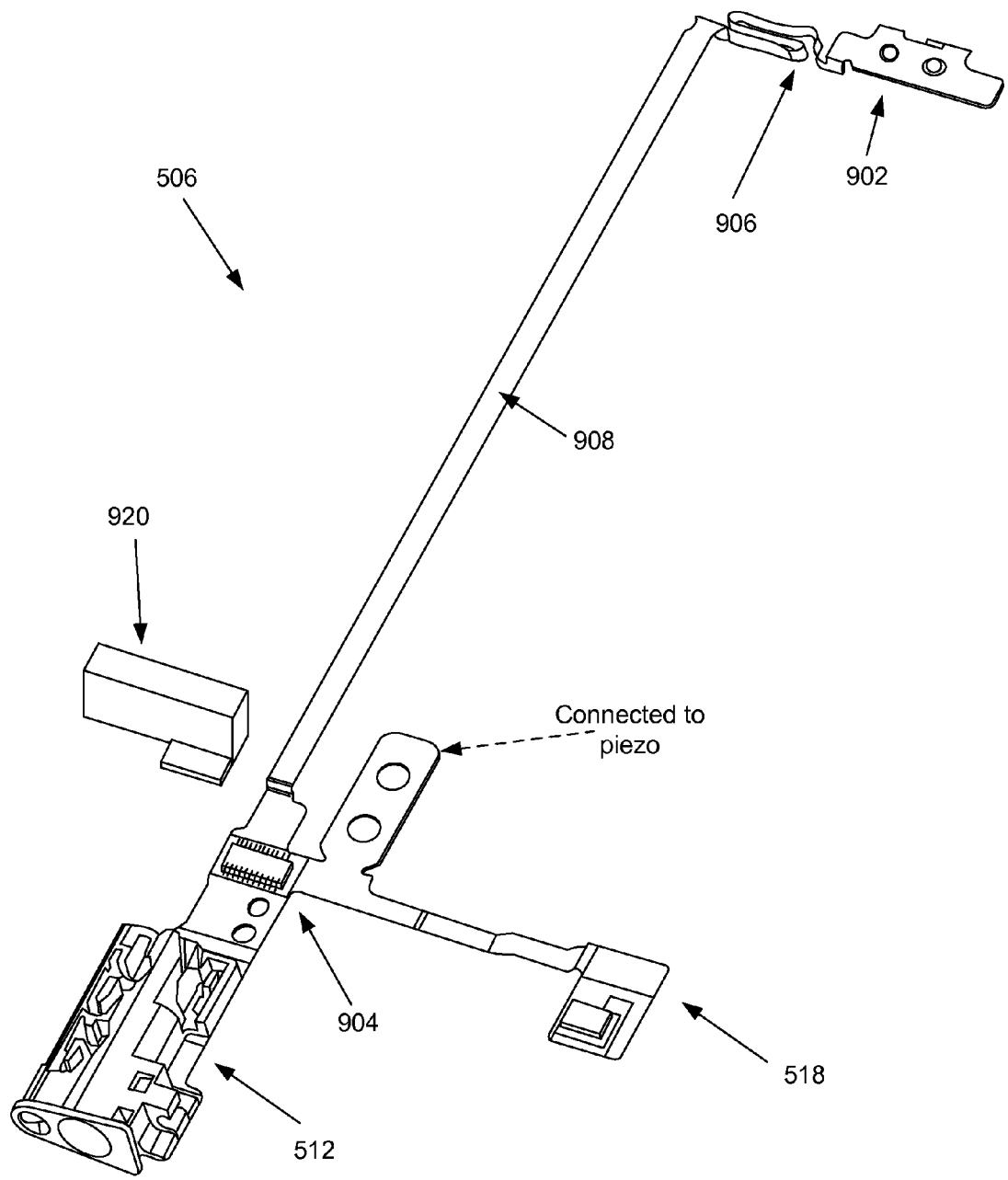
FIG. 9 shows an embodiment of I/O flex.

FIG. 9 shows an embodiment of I/O flex 506. I/O flex 506 can connect audio module 512, microphone module 518, hold button circuit 510 (by way of hold switch circuit connector 902), and piezo-electric audio transducer 520 to an external circuit (such as PCB 504 or a separate power supply) by way of board to board connector 904. As shown, I/O flex 506 can include service loop portion 906 connecting body 908 of I/O flex 506 to hold button circuit connector 902. Service loop portion 906 can provide the assembly operator the ability to adjust the position of hold switch 122. An advantage to I/O flex 506 lies in the fact that once a particular component(s) (audio module 512, for example) is/are connected to I/O flex 506, connector 904 can be connected to an external power supply either directly or by way of another circuit 920 or circuit board (such as a test fixture) for stand-alone testing of any or all of the components connected thereto.

Figure 10:
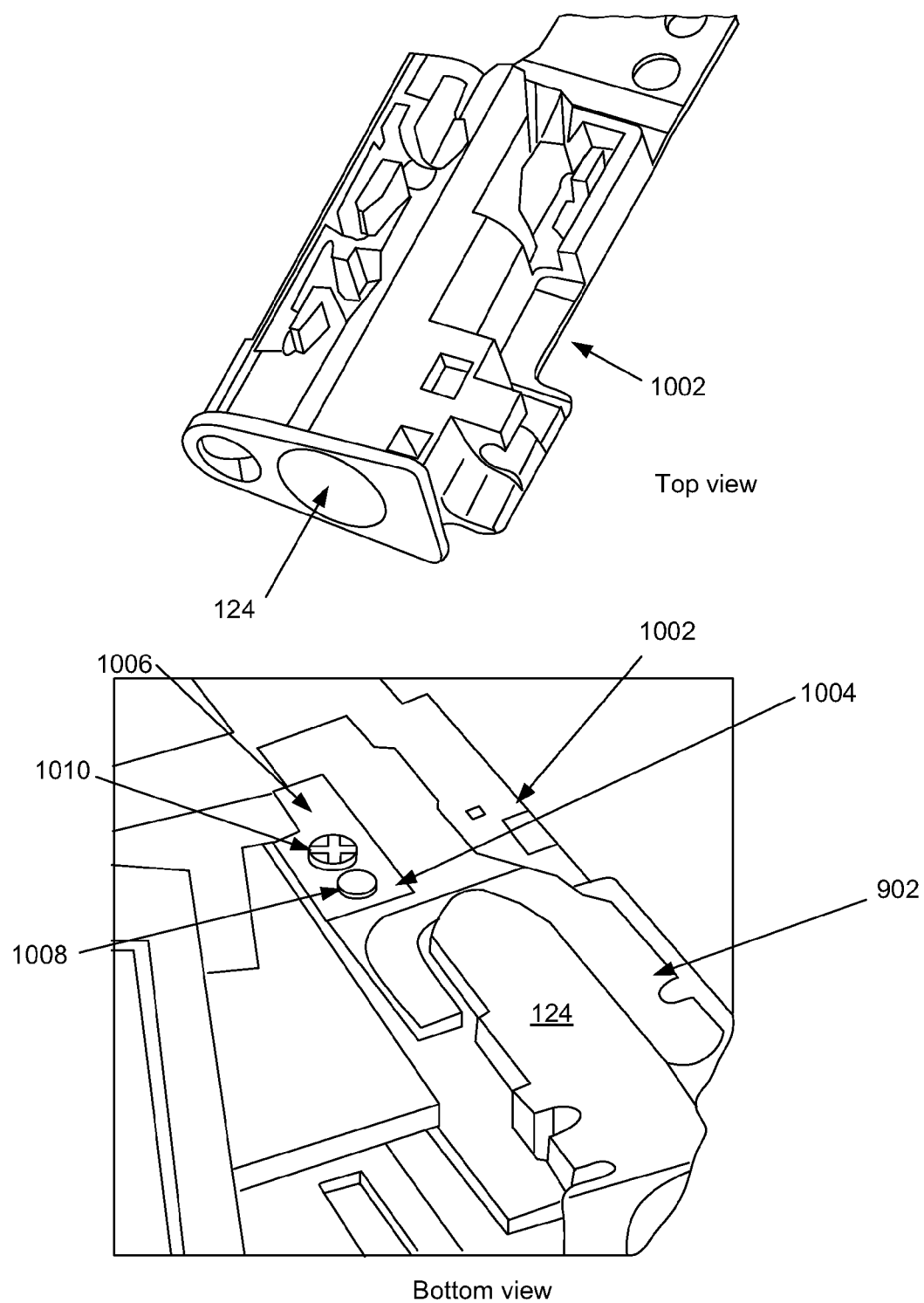
FIG. 10 shows a top and bottom view of audio module in accordance with the described embodiments.

FIG. 10 shows a top and bottom view of audio module 512 in accordance with the described embodiments. Audio module 512 can be operatively coupled to the PCB 504 and its various components by way of I/O flex 506. Audio module 512 can include an audio processing circuit 1002 and an audio jack 124. Audio module 512 can be accommodated by audio module cut-out of metal frame 502 and mechanically coupled to the PCB 504 by way metal frame 502 so that the PCB 504 and audio module 512 can form an integrated structure. By way of example, they can be both be coupled to metal frame 502 together using fasteners, and/or snaps. Stiffener plate 1004 (seen in the bottom view of audio module 512) can be used to attach I/O flex 506 to audio module 512. Stiffener plate 1004 can be formed of metal such as stainless steel (tin plated for example), gold, etc. Stiffener plate 1004 can also include stiffener arm 1006 used to prevent undue flexion in flex 506 by distributing stress more evenly across stiffener plate 1004. Stiffener plate 1004 can also include a locator hole (not shown) arranged to accommodate locator post 1008 on PCB 504. During the assembly of audio module 512 on PCB 504, the locator hole can be mated to locator post 1008 in order to more easily align audio module 512. Furthermore, by soldering locator post 1008 to stiffener plate 1004, a suitable RF ground can be obtained providing for an FM antenna and associated circuitry to be ported through audio module 512. It should be noted that metal hold down screw 1010 can securely fasten I/O flex 506 to audio module 512. Metal hold down screw 1010 can provide additional grounding.

Figure 11:
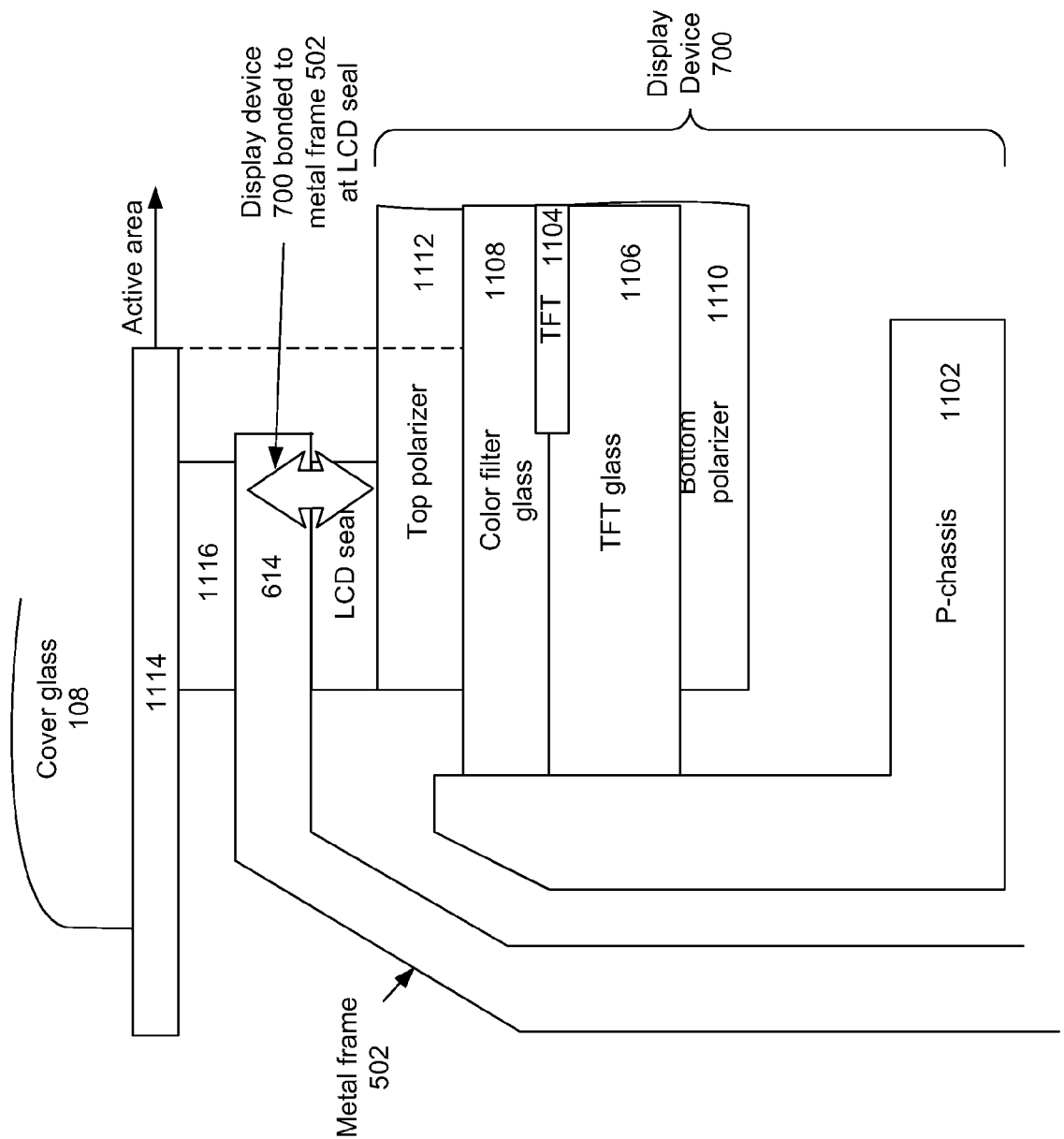
FIG. 11 shows a representation of cover glass assembly and display device in relation to metal frame in accordance with the described embodiments.

FIG. 11 shows a representation of cover glass assembly 1100 in accordance with the described embodiments. Display device 700 can include plastic chassis (p-chassis) 1102 providing support for components used to form display device 1100. Such components can include display circuits layer 1104 (in the form of TFT or twisted field transistors) mounted between TFT glass layer 1106 and color filter glass layer 1108. In the described embodiment, bottom polarizer layer 1110 can be attached to a bottom surface of TFT glass layer 1106 and a top polarizer layer 1112 can be mounted to an upper surface of color filter glass layer 1108. LCD seal layer has a lower surface attached to upper surface of top polarizer layer 1112 and an upper surface bonded to metal frame 502 at display mounts 614. In this way, in contrast to conventional approaches, p-chassis 1102 is not bonded directly to metal frame 502. Black mask 1114 can be placed under cover glass 108. Black mask 1114 can be used to define the viewable, or active area, of display 104. Cover glass seal 1116 can be used to seal the area between black mask 1114 and metal frame 502.

Figure 12:
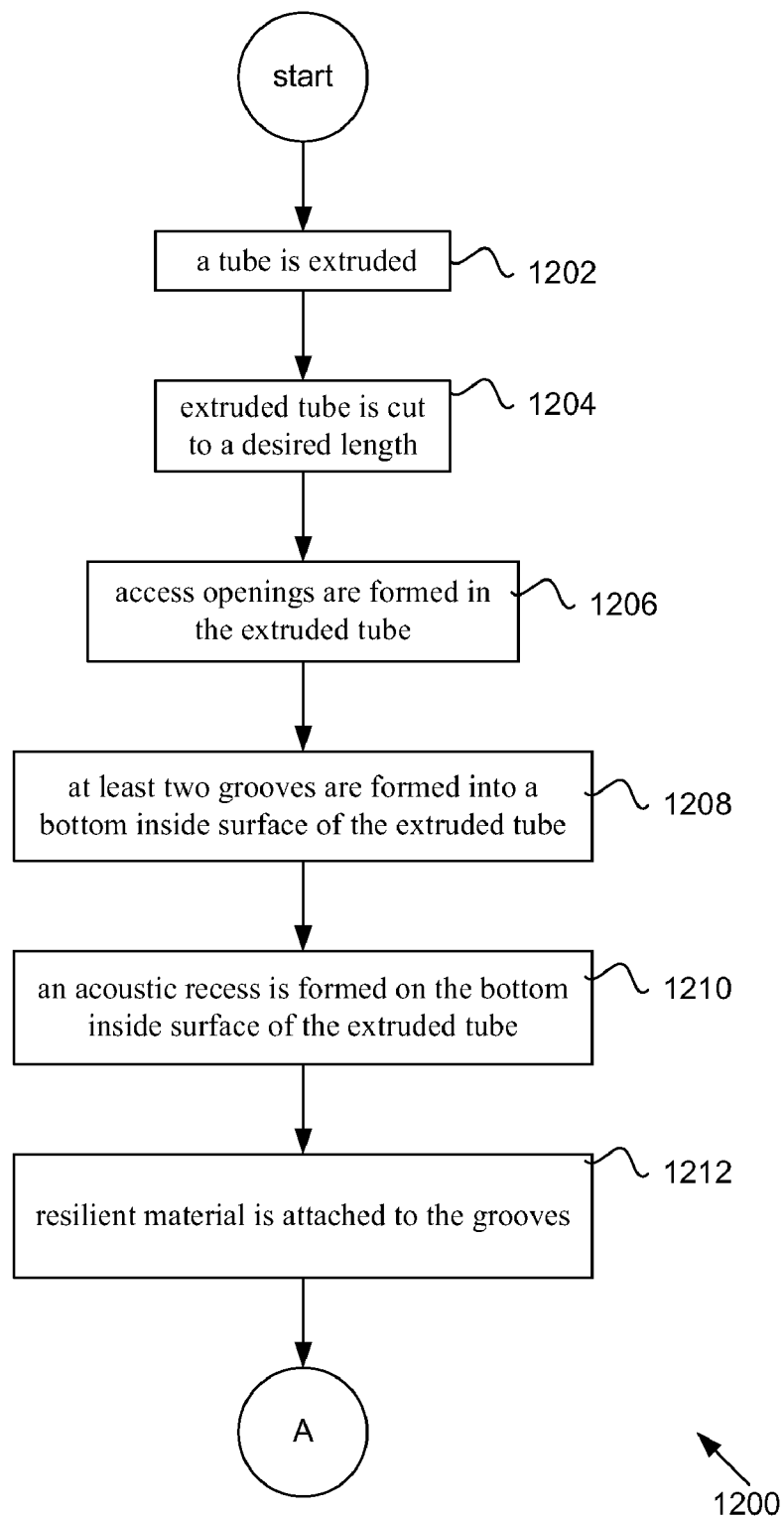
FIGS. 12-14 shows a flowchart detailing a process for manufacturing a portable electronic device in accordance with the embodiments described herein.
Figure 13:
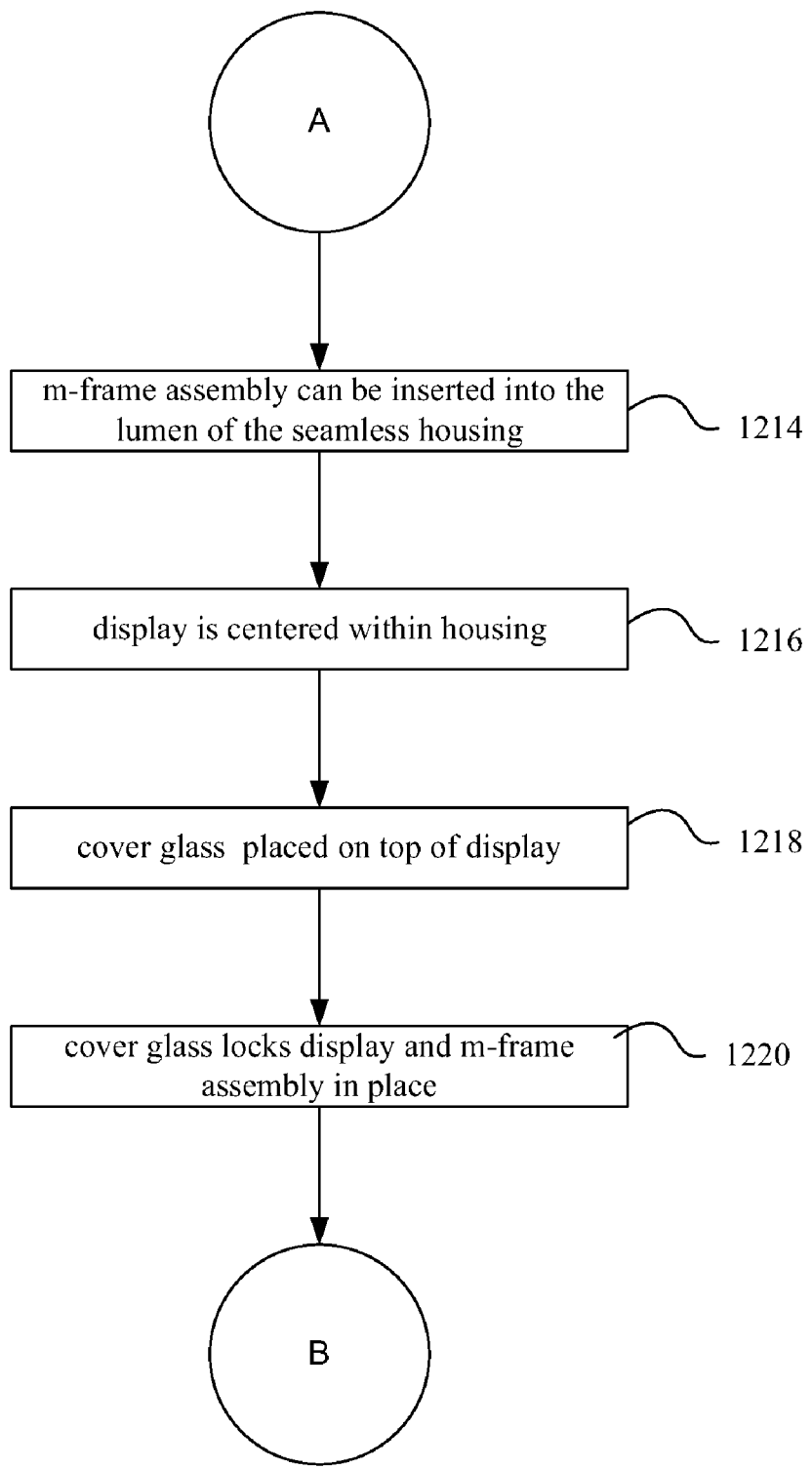
Figure 14:
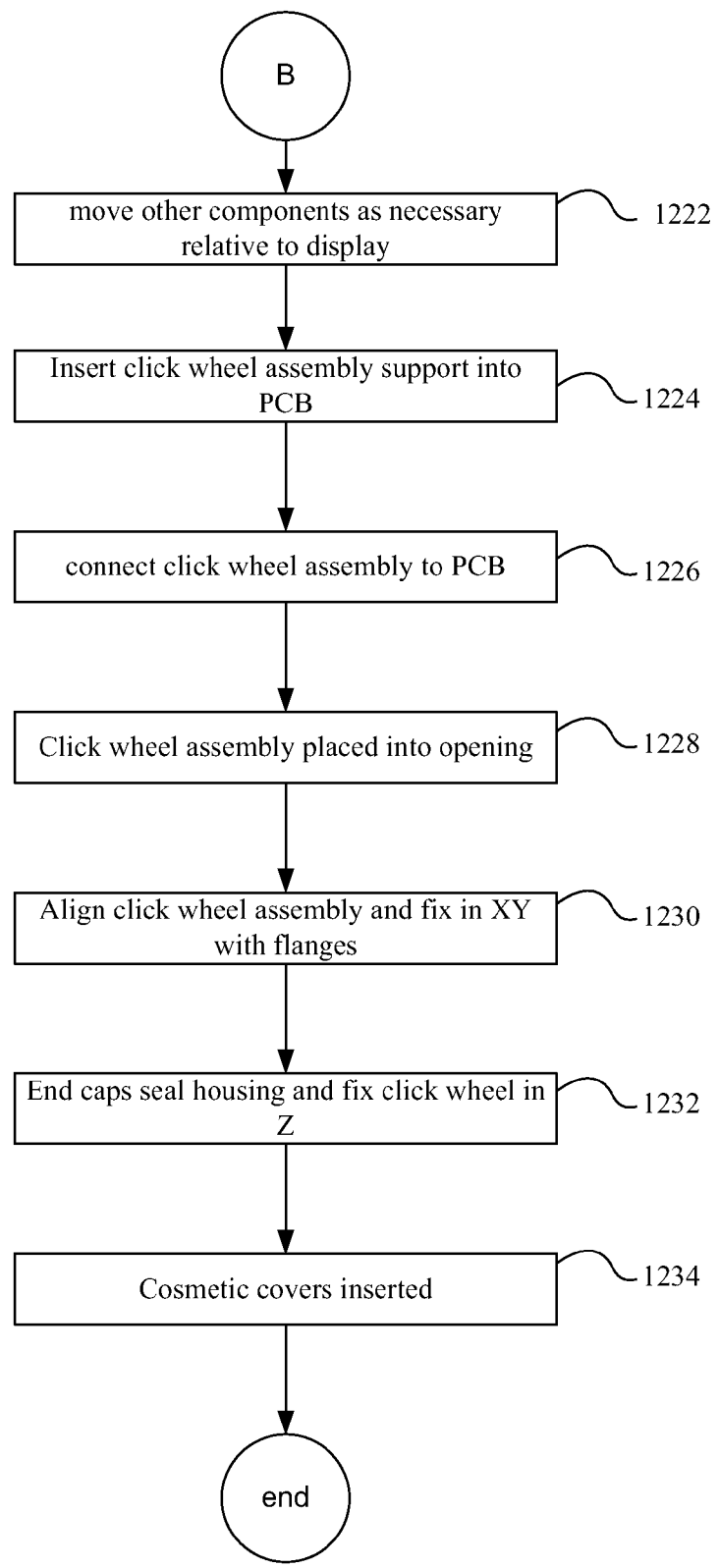

FIGS. 12-14 are flowcharts describing method 1200 of manufacturing a portable electronic device in accordance with the described embodiments. The method generally includes several operations including: the formation of the seamless housing, the insertion of fixing of m-frame assembly into the seamless housing, and the placement and fixing of stand-alone click wheel assembly into the seamless housing, and the placement end caps and cosmetic caps sealing the seamless housing.

Referring first to FIG. 12 and the formation of the seamless housing, the operation starts with block 1202 where a tube is extruded. Following block 1202, the operation proceeds to block 1204 where the extruded tube is cut to a desired length thereby exposing open ends. Following block 1204, the operation proceeds to block 1206 where the access openings are formed in the extruded tube. By way of example, the access openings can be associated with a user interface of the electronic device, a display window, and a camera opening. Following block 1206, the operation proceeds to block 1208 where at least two grooves are formed into a bottom inside surface of the extruded tube. By way of example, the grooves can be formed by machining the bottom inside surface of the extruded tube. Following block 1208, the operation proceeds to block 1210 where an acoustic pocket is formed on the bottom inside surface of the extruded tube. The acoustic pocket can be formed by machining a specific amount of the extruded tube. Following block 1210, resilient material, such as plastic is attached to the grooves at 1212.

Referring now to FIG. 13, during assembly and referring to the open end of the seamless housing, m-frame assembly can be inserted into the lumen of the seamless housing as a single unit at 1214. Metal frame essentially acts as a carrier for placing these components inside the seamless housing. During assembly, m-frame assembly can be inserted into lumen by sliding m-frame assembly through open end until display is centered within housing at 1216. Once display is centered, cover glass can be placed on top of display at 1218. Cover glass can then be seated to the display using adhesive and locked to housing by way of a flange on cover glass at 1220. The force of pushing cover glass onto display is resisted by the resilient material attached to grooves causing display to be biased up in such as way as to affix display device to metal frame.

Turning now to FIG. 14, once display has been centered within window and fixed in place, cross over flex can allow PCB to be moved as necessary to align audio jack, camera, and piezo at 1222. Once m-frame assembly and its constituent parts have been aligned to the appropriate positions vis a vis housing, click wheel assembly support can be dropped or otherwise placed into an appropriate space in PCB at 1224. Once click wheel support is in place, click wheel assembly can be electrically connected to PCB at 1226 and then placed within the seamless housing in the click wheel opening at 1228. Click wheel assembly can be aligned to housing and in particular, center button can be rotatably aligned as needed to conform to the shape of housing at 1230. End caps can then be used to seal portable electronic device and to lock click wheel assembly in place at 1232. Cosmetic covers can be placed over end caps at 1234.

While this invention has been described in terms of several preferred embodiments, there are alterations, permutations, and equivalents, which fall within the scope of this invention. It should also be noted that there are many alternative ways of implementing the methods and apparatuses of the present invention. For example, although an extrusion process is preferred method of manufacturing the integral tube, it should be noted that this is not a limitation and that other manufacturing methods can be used (e.g., injection molding). It is therefore intended that the following appended claims be interpreted as including all such alterations, permutations, and equivalents as fall within the true spirit and scope of the present invention.

What is claimed is:

1. A method of assembling a portable electronic device, comprising:
   providing a seamless housing, the seamless housing comprising at least a first open end and a resilient reference structure formed on an inside surface of the housing;
   inserting a pre-tested device module into the first open end using the resilient reference structure as a guide, the device module including a display assembly and a main logic board (MLB) assembly, wherein the display assembly is fixed to a frame and wherein the MLB assembly is moveably mounted to the frame such that the MLB assembly can move relative to the display assembly;
   affixing the location of the display assembly to a reference point on the seamless housing with a cover glass, thereby locking the device module into place;
   coupling the display assembly to the MLB assembly using a cross over flex, the cross over flex comprising a first connector, a second connector and a flexible body electrically coupling the first connector and the second connector, the flexible body allowing the second connector to rotate and translate with respect to the first connector, the coupling comprising:
  connecting the first connector to the display assembly,
  rotating and translating the second connector with respect to the first connector and,
  connecting the second connector to the MLB assembly; and
positioning the MLB assembly in relation to the fixed display assembly.

2. The method as recited in claim 1, comprising:
electrically connecting a pre-tested user interface module to the device module; and
locking the user interface module into place using an end cap having a locking tab.

3. The method as recited in claim 2, wherein the seamless housing includes a display opening.

4. The method as recited in claim 3, wherein the locking the device module into place comprises:
  centering the display assembly in the display opening;
  placing the cover glass within the display opening, the cover glass having a locking mechanism, the locking mechanism configured to interact with the housing at the display opening to lock the cover glass in place;
  pressing on the cover glass to engage the locking mechanism, wherein the pressing forces the display assembly to compress and engage the resilient reference structure.

5. The method as recited in claim 1, wherein the portable electronic device includes a camera module.

6. The method as recited in claim 5, further comprising:
aligning the camera module to the housing a camera alignment pin, the camera alignment pin having a head portion and a pin portion.

7. The method as recited in claim 6, wherein the aligning using the camera alignment pin comprises:
  inserting the camera alignment pin portion through a pin hole in a rear portion of the housing, wherein the pin hole is shaped in accordance with the shape of the camera alignment head portion;
  inserting the pin portion through a camera alignment hole in the camera module; and
  inserting the camera alignment pin portion into a camera alignment hole, wherein the camera alignment hole is formed from a front portion of the housing such that the alignment pin portion is anchored in the camera alignment hole and the camera alignment head portion is fitted into the pin hole in the rear portion of the housing such that the camera module is supported by the front and rear portions of the housing.

8. The method as recited in claim 5, further comprising:
a camera boot, wherein the camera boot includes a plurality of grooves, the plurality of grooves used to form a dust seal slideably formed with the housing.

9. A portable electronic device, comprising:
a housing;
a main logic board, (MLB) assembly including a board-to-board connector for coupling to a flex connector, wherein the MLB is positioned within the housing; and
a integrated flex connector adapted for electrically connecting each of a plurality of components to the board to board connector on the MLB, the components arranged in at least two dimensions comprising:
  a single electrical board to board connector,
  a hold switch connector coupled to the board to board connector through a service loop, wherein the service loop accommodates positional adjustments between a hold switch disposed on the housing and the integrated flex connector;
  a first portion having a first connector electrically connected to the single electrical board to board connector,
  a second portion independent of the first portion, the second portion having a second connector electrically connected to the single electrical board to board connector, and
  a third portion independent of the first portion and the second portion, the third portion having a third connector electrically connected to the single electrical connector, wherein the single electrical connector provides an independent electrical path for the each of the first, second, and third connectors to a external circuit wherein the external circuit is a test fixture, configured to test the functionality each of the first, the second and the third components independently, wherein a first component connected to the first connector is a microphone, a second component connected to the second connector is an audio module, and a third component connected to the third connector is a piezo-acoustic module.

10. The portable electronic device as recited in claim 9, wherein the first component connected to the first connector or the second component connected to the second connector or the third component connected to the third connected can each independently receive power from the external circuit.

11. The portable electronic device as recited in claim 9, wherein those of the first, the second, and the third components that fail the function test can be replaced prior to insertion into a portable electronic device.

12. The portable electronic device as recited in claim 9, wherein the integrated flex connector electrically connects the microphone, the audio module, and the piezo-acoustic module each independently to the main logic board in the portable electronic device.

13. A portable electronic device, comprising:
a housing, the housing having a top opening and a side opening;
a display assembly, the display assembly comprising a display, the display centered at the top opening and fixed to the housing;
a main logic board, (MLB) assembly, wherein prior to attachment of the MLB assembly to the housing during a portable electronic device assembly operation, the MLB assembly floats with respect to the display assembly; and
a cross over flex arranged to electrically connect the display assembly and the MLB assembly and provide a mechanism for adjusting a position of the floating MLB assembly with respect to the fixed display assembly, the cross over flex comprising:
  a first connector, the first connector connected to the display assembly,
  a second connector, the second connector connected to the MLB assembly, and
  a fold over body portion, the fold over body portion comprising electrical conductors and having a length sufficient to permit the second connector to rotate and translate with respect to the first connector when connected to the display assembly for adjusting the position of the floating MLB assembly.

14. The portable electronic device of claim 13, wherein the housing further comprises:

a cover glass;

at least two grooves arranged on an inner surface of the housing; and rails arranged to fit into the grooves and form an internal reference structure wherein the internal reference structure cooperates with the display assembly and the cover glass to force the cover glass against the housing and position an upper surface of the cover glass flush with an outer surface of the housing.

15. The portable electronic device of claim 14, wherein the housing is formed of metallic or plastic material.

16. The portable electronic device of claim 13, further comprising an end cap configured to seal the side opening, wherein the end cap shaped to conform to a internal cross section of the housing.

* * * * *